US007074634B2

(12) United States Patent
Foglietti et al.

(10) Patent No.: US 7,074,634 B2
(45) Date of Patent: Jul. 11, 2006

(54) SURFACE MICROMACHINING PROCESS FOR MANUFACTURING ELECTRO-ACOUSTIC TRANSDUCERS, PARTICULARLY ULTRASONIC TRANSDUCERS, OBTAINED TRANSDUCERS AND INTERMEDIATE PRODUCTS

(75) Inventors: Vittorio Foglietti, Rome (IT); Elena Cianci, Rome (IT); Daniele Memmi, Rome (IT); Giosué Caliano, Rome (IT); Massimo Pappalardo, Rome (IT)

(73) Assignees: Consiglio Nazionale Delle Ricerche, Rome (IT); Esaote S.p.A., Casale Monferrato (IT); Universita' Degli Studi-Roma Tre, Rome (IT)

( * ) Notice: Subject to any disclaimer, the term of this patent is extended or adjusted under 35 U.S.C. 154(b) by 0 days.

(21) Appl. No.: 10/476,254

(22) PCT Filed: May 9, 2002

(86) PCT No.: PCT/IT02/00308

§ 371 (c)(1),
(2), (4) Date: May 7, 2004

(87) PCT Pub. No.: WO02/091796

PCT Pub. Date: Nov. 14, 2002

(65) Prior Publication Data

US 2004/0180466 A1 Sep. 16, 2004

(30) Foreign Application Priority Data

May 9, 2001 (IT) ........................... 2001A000243

(51) Int. Cl.
*H01L 21/00* (2006.01)

(52) U.S. Cl. .......................................... 438/50; 438/53

(58) Field of Classification Search ............ 438/27–29, 438/34, 50, 57, 66, 68, 72, 73, 460, 53
See application file for complete search history.

(56) References Cited

U.S. PATENT DOCUMENTS 5,025,346 A 6/1991 Tang et al.
5,366,587 A * 11/1994 Ueda et al. ................. 216/101
5,573,679 A * 11/1996 Mitchell et al. ............... 216/2
6,096,656 A 8/2000 Matzke et al.

* cited by examiner

*Primary Examiner*—Brook Kebede
(74) *Attorney, Agent, or Firm*—Young & Thompson

(57) ABSTRACT

A surface micromachining process for manufacturing Electro-acoustic transducers, particularly ultrasonic transducers, the transducers comprising a silicon semiconductor substrate (1), on an upper surface of which one or more membranes (18) of resilient materials are supported by a structural layer (11) of insulating material, rigidly connected to the semiconductor substrate (1), the resilient material having a Young's modulus not lower than 50 GPa, the membranes (18) being metallised, the transducers including one or more lower electrodes (23, 25), rigidly connected to the semiconductor substrate. The process is characterised in that the structural layer (11) includes silicon monoxide. The invention further relates to an Electro-acoustic transducer, particularly an ultrasonic transducer, characterised in that the insulating material of the structural layer (11) is silicon monoxide. The invention also relates to an intermediate product for utilisation in the process for realising Electro-acoustic transducers, particularly ultrasonic transducers.

46 Claims, 15 Drawing Sheets

FIG. 1A
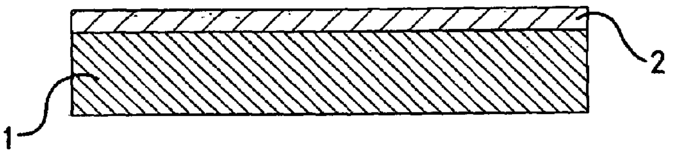
FIG. 1B
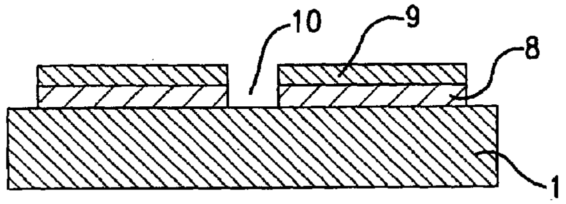
FIG. 1C
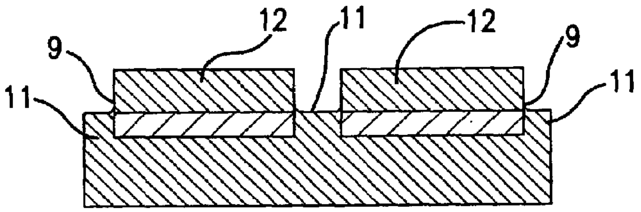
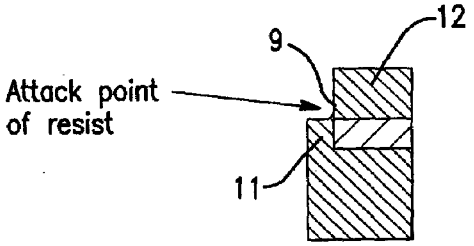
FIG. 1D
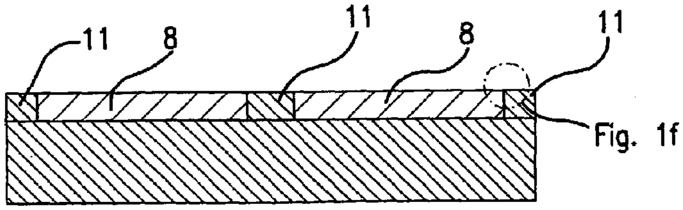
FIG. 1E
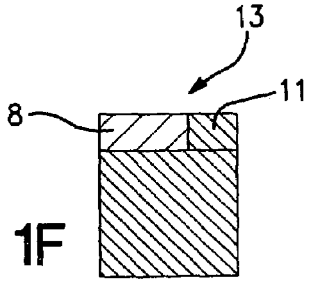
FIG. 1F

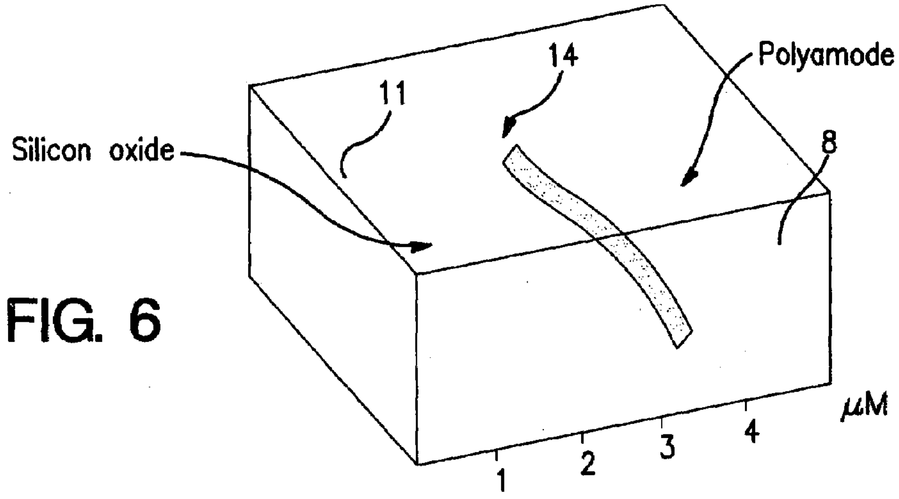
FIG. 6
FIG. 7
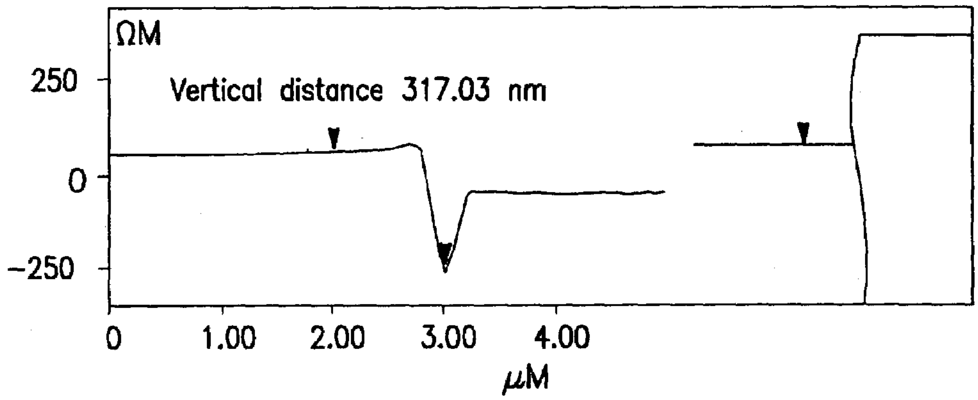
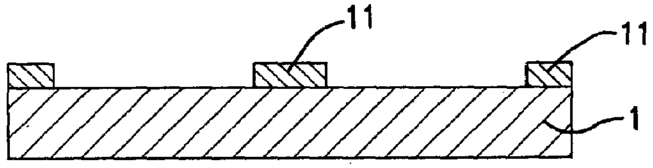
FIG. 8A
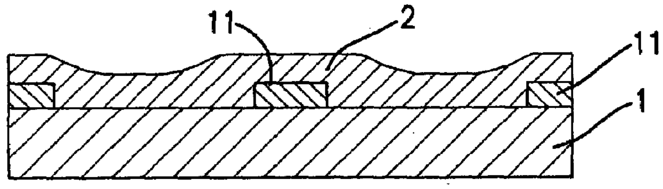
FIG. 8B
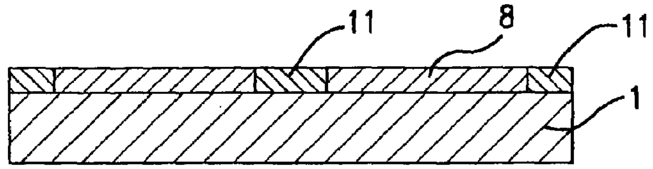
FIG. 8C

SURFACE MICROMACHINING PROCESS FOR MANUFACTURING ELECTRO-ACOUSTIC TRANSDUCERS, PARTICULARLY ULTRASONIC TRANSDUCERS, OBTAINED TRANSDUCERS AND INTERMEDIATE PRODUCTS

This invention relates to a surface micromechanical process for manufacturing Electro-acoustic transducers, particularly ultrasonic transducers, which enables an extremely high design flexibility to be achieved, in respect of the geometry and of the electrical and mechanical features of the device, as well as the maximum compatibility with the integration of control electronics directly on a substrate incorporating the transducers.

Furthermore, this invention relates to an Electro-acoustic transducer manufactured by the above process and to an intermediate product of said process.

It is known that the ultrasonic electrostatic capacitive transducers represent a suitable alternative to the piezoelectric transducers, since they are a solution of the problem of the 5 magnitudo order of mismatch with the air acoustical impedance. Such electrostatical capacitive transducers, also designated as cMUT (Capacitive Micromachined Ultrasonic Transducers) are manufactured by planar surface micromanufacturing techniques on silicon, thereby offering the possibility to integrate the control electronics on the same chip.

The above mentioned cMUT devices are specifically used for ecographic image acquisition, even if their application is not exclusively restricted to such field. In particular, these transducers enable to carry out multi-frequency ecographic scanning as well as the acquisition of three-dimensional images in real time, with a scarcely invasive examination, such as an acoustic examination.

The micromanufactured capacitive transducers were firstly realised in 1998 at the Stanford University, California, where a search team directed by Khuri Yakub has been working in this field for about ten years.

In particular, the relevant prior art includes U.S. Pat. No. 5,619,476, upon which the preamble portions of claims 1, 47 and 60 are based, disclosing three processes for manufacturing corresponding transducers.

The first process provides for a silicon substrate upon which a thermally grown sacrificial layer of silicon dioxide is realised. In particular, the thermal oxidation of the silicon broadly occurs at temperatures in the range of 900° C. to 1200° C. A layer of silicon nitride is then deposited on said sacrificial layer by a low pressure chemical vapour deposition procedure or LPCVD procedure, which is generally carried out at temperatures in the range of 700° C. to 900° C. Lastly, the sacrificial layer is partially removed by an etching operation which should be carefully timed in order to control the membrane size. At the end of the process, one obtains transducers comprising membranes of silicon nitride supported by portions of the silicon dioxide sacrificial layer that have not been removed by the etching operation.

A second process provides for realising by a deposition procedure grooves of silicon nitride aimed at defining the borders of the silicon dioxide sacrificial layer areas, in order both to realise membranes of arbitrary shapes and to make the chemical etch timing less critical. At the end of the process, one obtains transducers comprising membranes of silicon nitride rigidly supported by the silicon nitride grooves. In particular, since the subsequently deposited layers of silicon nitride raise adhesion problems when the deposition is carried out at low temperature, it is apparent that the concerned silicon nitride should be deposited also in this second process by means of a LPCVD procedure at high temperature.

A third process provides for a glass substrate upon which a polyamide sacrificial layer is realised. A layer of silicon nitride is deposited upon said sacrificial layer by means of a plasma enhanced chemical vapour deposition on PECVD procedure, which necessarily takes place at low temperatures, in the range of 200° C. to 400° C., in order not to burn the polyamide. Lastly, the sacrificial layer in partially removed by means of a carefully timed chemical etching operation aimed at controlling the membrane size. At the end of the process, one obtains transducers comprising silicon nitride membranes supported by portions of the polyamide sacrificial layer not removed by said etching operation. The known prior art also includes document 1. Ladabaum, X. Jin, H. T. Soh, A. Atalar and B. T. Khuri Yakub, "Surface Micromachined Capacitive Ultrasonic Transducers", IEEE Trans. Ultrason. Ferroelect. Freq. Contr., Vol 45, pp. 678–690, May 1998, that, in the assumption of a theoretical model representing the Electro-acoustic behaviour of an ultrasonic transducer, discloses a manufacturing process similar to the process described in U.S. Pat. No. 5,619,476.

The known prior art further includes U.S. Pat. No. 5,870,351 that discloses a process for manufacturing a large band ultrasonic transducer comprising a plurality of membranes of different geometric shapes electrically connected with one another. The disclosed manufacturing process is similar to the first process described in U.S. Pat. No. 5,619,476, with the possible variation in which a plastic material ring is provided for limitation of the sacrificial layer areas corresponding to the membranes.

Further included in the known prior art is U.S. Pat. No. 5,894,452 disclosing a process for manufacturing an ultrasonic transducer adapted to operate in submerged condition in a fluid. The manufacturing process as disclosed is again analogous to the first process described in U.S. Pat. No. 5,619,476, with addition of a further step aimed at sealing the vias by CVD deposition of a further silicon nitride layer. In this process, the size of the concerned vias appears to be particularly critic, in order to guarantee that no silicon nitride is introduced under the membranes during the sealing step.

The known prior art also includes U.S. Pat. No. 5,982,709 that discloses a process for manufacturing an ultrasonic transducer wherein the membranes and their supports are formed during the same silicon nitride deposition and wherein the material deposited for sealing the vias is prevented from reaching the area underlying the membranes by defining the vias only in correspondence to tanks and to complex connection channels between the vias and the underlying areas of the membranes. This manufacturing process is analogous to the second process described in U.S. Pat. No. 5,619,476, with the possible variation of a polysilicon sacrificial layer, aimed at increasing the selectivity of the etching solution. Also in this process, the size of the vias appears to be particularly critic.

Lastly, the known prior art also includes PCT Application No. WO 00/72631, that disclosed an acoustic transducer and a process for manufacturing it similar to the previously mentioned ones, in which the lower metallisation is realised in the chambers formed just under the membranes. The described manufacturing process uses aluminium or silicon oxide deposited at low temperature as sacrificial materials. The materials utilised for making the electrodes are aluminium or copper or tungsten having low resistivity.

The processes disclosed in the prior art, particularly in U.S. Pat. No. 5,619,476 have some drawbacks.

In the first place, the sacrificial layer, the membranes and the membrane supports are realised with only two different materials. This makes the selection of the process parameters and of the chemical etching solutions particularly critic for the obtainment of high selectivities, in order to control the geometry and the electrical and mechanical features of the process. Obviously, these critical aspects of the process make the latter particularly complex and expensive.

Furthermore, many processing steps are carried out at high temperatures, no lower than 600–700° C., thereby making the selection and the control of the process parameter additionally critic and reducing compatibility of the concerned process with the integration of control electronics on the same substrate on which the transducers are realised.

In addition, the utilised materials and the processing temperatures cause an irregular planarity of the manufactured devices, thereby causing the establishment of significant parasitic capacitances in the transducers themselves, which, in turn, jeopardise their correct operation modes.

Furthermore, the third process as proposed by the U.S. Pat. No. 5,619,476 appears to be quite inefficient, due to the fact that polyamide is quite unsuitable as a support layer. In fact, this material has a quite low Young's modulus and therefore, a polyamide support for the concerned membranes would track the vibrations thereof, by absorbing them and generating beat effects. In addition, the intrinsic compression stress of the silicon nitride membranes deposited by a PECVD deposition procedure at low temperature appears to be extremely high, thereby further making the concerned membranes highly inefficient, while the membranes themselves should have a small intrinsic tensile stress. On the other hand, should it be desired to use silicon nitride layers as supports of the membranes (and possibly as grooves of the sacrificial layer), a further drawback would be encountered caused by the low adhesion of the subsequently deposited membranes of silicon nitride; in fact, the requirement to have high temperatures in order to obtain a good adhesion could not be fulfilled because, in stead, low process temperatures are necessarily required in order to prevent the polyamide from burning. In effect, the just above discussed problems in respect of the third process have resulted into elimination of such approach from all above mentioned known prior art subsequent to U.S. Pat. No. 5,619,476.

Also in PCT Application No. WO/0072631 the sacrificial layers of aluminium or silicon oxide deposited at low temperature raise the drawbacks due to the poor selectivity of the chemical etching operations needed for their elimination, thereby making the manufacturing process critic and, consequently, complex and expensive.

Furthermore, the residual mechanical stress level of the membranes of a transducer manufactured by the above discussed known processes is particularly high and hardly controllable, since it noticeably depends on the proportion between silicone ($SiH_4$) and ammonia ($NH_3$) and anyway it cannot be handled in arbitrary manner.

Lastly, the membranes have high gradients of mechanical stress, due to the fact that the membranes themselves have apertures or vias in the silicon nitride layer, as needed to permit the sacrificial layer to be etched. U.S. Pat. No. 5,982,709 proposes a solution to overcome such problem by means of a complex and expensive definition of patterns comprising grooves and intricate channels.

It is an object of this invention, therefore, to provide a surface micromechanical process for manufacturing Electro-acoustic transducers which enable to achieve in simple, inexpensive and reliable way a high design flexibility, in respect of the geometry as well as the electrical and mechanical features of the device, together within the maximum compatibility with the integration of control electronics directly on the same substrate incorporating the transducers.

Another object of this invention is to provide a process of the above kind to maximise the planarity of manufactured transducers and to enable a dramatic reduction of the parasitic capacitances to be achieved in such devices.

Such objects are realised by using silicon monoxide deposited at low temperature, as a structural support layer for the membranes.

A further object of this inventions to provide a process of the above kind which enables a substantially arbitrary reduction to be obtained in the residual mechanical stresses in the membranes of the manufactured transducers.

A still further object of this invention is to provide a process of the above kind which enables a dramatic reduction of the mechanical stress gradients in the membranes as caused by presence of vias therein. It is specific subject-matter of this invention to realise a surface micromachined process for manufacturing Electro-acoustic transducers, particularly ultrasonic transducers, said transducers comprising a silicon semiconductor substrate, on an upper surface of which one or more membranes of resilient materials are supported by a structural layer of insulating material, rigidly connected to said semiconductor substrate, said resilient material having a Young's modulus not lower than 50 GPa, said membranes (18) being metallised, said transducers including one or more lower electrodes, rigidly connected to said semiconductor substrate, the process comprising the following steps:

A. providing a silicon semiconductor substrate,

B. realising an intermediate product comprising:
   - a sacrificial layer, and
   - a structural layer of insulating material, rigidly connected to an upper surface of said silicon semiconductor substrate, the surfaces of said sacrificial layer and of said structural layer not in contact with said substrate being substantially co-planar, C. depositing a layer of said resilient material on said sacrificial layer and on said structural layer, and D. releasing said membranes of said resilient material by removing said sacrificial layer from the product obtained according to said step C., said process being characterised in that said structural layer includes silicon monoxide.

Preferably according to this invention, all of the steps of the process are carried out at temperatures no higher than 600° C. and even more preferably at temperatures no higher than 530° C.

Preferably according to this invention, said resilient material has a value of the Young's modulus no lower than 100 GPa.

Even more preferably according to this invention, said resilient material comprises silicon nitride.

According to this invention, said resilient material can comprise crystalline silicon.

Preferably according to this invention, said sacrificial material comprises chromium.

Alternatively according to this invention, said sacrificial material comprises an organic polymer selected among the group comprising polyamides and polymers of benzocyclobutene and its derivatives, preferably polyamide and even more preferably N-methyl-2-pyrolidone.

According to this invention, said step D can comprise the following successively ordered sub-steps:

D.1 realising one or more apertures or vias on said layer of resilient material, adapted to enable accessing the sacrificial layer from outside, and D.2 thermally treating by annealing the product obtained according to said step C.

Further according to this invention, during execution of said sub-step D.2, the product obtained according to said step C is heated to a temperature in the range of 490° C. to 530° C.

Again according to this invention, said sub-step D.2 can be of a duration adapted to completely eliminate the organic polymer existing in the product obtained according to said step C.

Still according to this invention, said step D can further comprise, indifferently before or after said sub-step D.1 or D.2, the following sub-step:

D.3 chemically etching said sacrificial layer.

Still according to this invention, said sub-step D.3 can comprise imaging the product in a wet etching solution for etching chromium.

Alternatively according to this invention, said sub-step D.3 can comprise imaging the product obtained according to said step C in a solution comprising sulphuric acid ($H_2SO_4$) and possibly hydrogen peroxide ($H_2O_2$), in which case said solution is a solution 7:3 of sulphuric acid ($H_2SO_4$) and hydrogen peroxide ($H_2O_2$).

Further according to this invention, when said sub-step D.3 is subsequent to said sub-step D.2, said step D can further comprise, after said sub-step D.3, the following sub-step:

D.4 thermally treating by annealing the product obtained according to said step D.

Also according to this invention, during execution of said sub-step D.4, the product obtained according to said step C can be heated to a temperature in the range of 490° C. to 530° C.

Preferably according to this invention, the total duration of the annealing operation for the product obtained according to said step C is adapted to make the intrinsic compression stress of the membranes (18) no higher than 10 MPa.

Again according to this invention, the total duration of the annealing operation for the product obtained according to said step C is adapted to make the intrinsic tensile stress of the membranes comprised in the range of 10 MPa to 50 MPa.

Further according to this invention, said vias can be external to the locations of said membranes and can be positioned at a distance therefrom adapted to introduce substantially negligible stress gradients, said sacrificial layer comprising channels to connect the positions of said vias to the locations of said membranes.

Still according to this invention, said step B can comprise the following successively ordered sub-steps:

B.1 depositing a chromium comprising layer on said upper surface of the semiconductor substrate, B.2 defining configurations or patterns in said chromium comprising layer by realising cavities in said chromium comprising layer, and B.3 filling said cavities in said chromium comprising layer by depositing silicon monoxide therein.

Alternatively according to this invention, said step B can comprise the following successively ordered sub-steps:

B.1 applying a polyamide comprising layer upon said upper surface of the semiconductor substrate, B.2 defining configurations or patterns in said layer polyamide comprising layer by realising cavities (10) in said in said polyamide comprising layer, and B.3 filling said cavities in said polyamide comprising layer by depositing silicon monoxide therein.

Still according to this invention, during said sub-step B.3, the silicon monoxide can be deposited by thermal evaporation.

Further according to this invention, said sub-step B.2 can comprise an optical lithographic process performed on said chromium comprising layer by utilising a masking layer of photographically patterned optical resist and a wet chemical etching of the chromium.

Alternatively according to this invention, said sub-step B.2 can comprise a dry reactive ion etching (RIE) operation performed on said polyamide comprising layer by utilising a masking layer of photolithographically patterned optical resist.

Still according to this invention, said step B can further comprise, after said sub-step B.3, the following sub-steps:

B.4 chemically etching said silicon monoxide by utilising a wet etching process, B.5 removing said optical resist.

Alternatively according to this invention, said step B can further comprise, after said sub-step B.3, the following sub-step:

B.4 removing the silicon monoxide deposited upon said optical resist by means of a lift off process.

Still according to this invention, said sub-step B.4 can also comprise dissolving said optical resist by means of an acetone and ultrasound dissolving process.

Alternatively according to this invention, said step B can comprise the following successively ordered sub-steps:

B.1 depositing a silicon monoxide comprising layer on said upper surface of the semiconductor substrate, B.2 defining configurations or patterns in said silicon monoxide comprising layer, B.3 applying a polyamide comprising layer upon said upper surface of the semiconductor substrate, provided with silicon monoxide, B.4 performing a chemical-mechanical polishing operation adapted to realise said intermediate product.

Still according to this invention, during said sub-step B.1, the silicon monoxide can be deposited by thermal evaporation.

Further according to this invention, said sub-step B.2 can comprise a dry reactive ion etching (RIE) operation performed on said silicon monoxide comprising layer by utilizing a masking layer of photolithographically patterned optical resist.

Preferably according to this invention, during said step C, said resilient material is deposited by a plasma enhanced chemical vapour deposition process (PECVD).

Still according to this invention, said process can further comprise, after said step D, the following step:

E. closing said vias by deposition of silicon monoxide adapted to fill up said vias, optical lithography, and RIE etching of the silicon monoxide deposited on said membranes.

Still according to this invention, during said step E, the silicon monoxide can be deposited by thermal evaporation.

Further according to this invention, said process can also comprise, before said step B, the following step:

F. realising a lower electrode on the upper surface of the semiconductor substrate in positions corresponding to each area in which said membranes are realised during said step D.

Again according to this invention, said step F comprises the following sub-steps:

F.1 depositing an insulating layer on the upper surface of the semiconductor substrate, F.2 depositing a conductive layer upon said insulating layer, F.3 defining configurations or patterns in said conductive layer.

Again according to this invention, said insulating layer can comprise thermal silicon dioxide $SiO_2$, said conductive layer can comprise evaporation deposited chromium, and said sub-step F.3 can comprise an optical lithographic process performed on said conductive layer by utilising a masking layer formed by a photolithographically patterned optical resist and a chemical wet etching of the chromium.

Further according to this invention, said step F can further realise a film for protection of said lower electrodes.

Still according to this invention, said protection film is realised by growing a film of silicon nitride SiN by means of a PECVD technique.

Alternatively according to this invention, said process can further comprise the following step:

F. realising one or more lower electrodes by metallisation of a lower surface of said semiconductor substrate.

Again according to this invention, said process can further comprise the following step:

G. metallising said membranes.

Preferably according to this invention, said silicon semiconductor substrate is a p-type doped silicon substrate having a resistivity no higher than 1 Ω.cm, preferably no higher than 2 Ω.cm.

Still according to this invention, said silicon monoxide comprising structural layer has a thickness in the range of 100 nm to 1000 nm, preferably in the range of 400 nm to 600 nm, and said membranes of said resilient material can have a thickness no higher than 1000 nm, preferably no higher than 600 nm.

It is further subject-matter of this invention the realisation of an Electro-acoustic transducer, particularly an ultrasonic transducer, comprising a silicon semiconductor substrate, on an upper surface of which one or more membranes of resilient materials are supported by a structural layer of insulating material, rigidly connected to said semiconductor substrate, said resilient material having a Young's modulus not lower than 50 GPa, said membranes being metallised, said transducer including one or more lower electrodes, rigidly connected to said semiconductor substrate, said transducer being characterised in that said insulating material is silicon monoxide.

Preferably according to this invention, said resilient material has a value of the Young's modulus no lower than 100 GPa.

Even more preferably according to this invention, said resilient material comprises silicon nitride.

Further according to this invention, said resilient material can comprise crystalline silicon.

Preferably according to this invention, the membranes of the transducer have an intrinsic compression stress no higher than 10 MPa.

Still according to this invention, said membranes of the transducer have an intrinsic tensile stress in the range of 10 MPa to 50 MPa.

Again according to this invention, said structural layer of the transducer can have a thickness in the range of 100 nm to 1000 nm, preferably in the range of 400 nm to 600 nm, and said membranes of the transducer can have a thickness no higher than 1000 nm, preferably no higher than 600 nm.

Preferably according to this invention, said one or more lower electrodes are realised on the upper surface of said semiconductor substrate in positions corresponding to each of said areas underlying said membranes.

Further according to this invention, said transducer can further comprises an insulating layer, underlying said lower electrodes, on the upper surface of said semiconductor substrate.

Still according to this invention, said insulating layer can comprise silicon dioxide $SiO_2$ and said conductive layer can comprise chromium.

Again according to this invention, said transducer can further comprise a film for protection of said lower electrodes.

Further according to this invention, said protection film can comprise silicon nitride SiN.

Alternatively according to this invention, said one or more lower electrodes are realised by means of a metallised layer on said lower surface of the semiconductor layer.

It is further subject-matter of this invention an intermediate product for realising Electro-acoustic transducers, particularly ultrasonic transducers, comprising a sacrificial layer, and a structural layer of insulating material, rigidly connected to an upper surface of said silicon semiconductor substrate, the surfaces of said sacrificial layer and of said structural layer not in contact with said substrate being substantially co-planar, said intermediate product being characterised in that said structural layer comprises silicon monoxide.

Preferably according to this invention, said sacrificial layer comprises chromium.

Alternatively according to this invention, said sacrificial material can comprise an organic polymer selected among the group comprising polyamides and polymers of benzocyclobutene and its derivatives.

Preferably according to this invention, said organic polymer comprises polyamide.

Still according to this invention, said sacrificial layer and said structural layer have a thickness in the range of 100 nm to 1000 nm, preferably in the range of 400 nm to 600 nm.

Again according to this invention, said intermediate product can further comprise a layer of resilient material having a Young's modulus no lower than 50 GPa, superimposed on said sacrificial layer (8) and on said structural layer.

Preferably according to this invention, said resilient material of the intermediate product has a value of the Young's modulus no lower than 100 GPa.

Even more preferably according to this invention, said resilient material of the intermediate product comprises silicon nitride.

Further according to this invention, said resilient material of the intermediate product can comprise crystalline silicon.

Still according to this invention, said layer of resilient material can have a thickness no higher than 1000 nm, preferably no higher than 600 nm.

The process according to this invention is innovative both in respect of the utilised materials and in respect of the implemented step set. The technologic process utilised a maximum temperature no higher than 600° C., thereby enabling an extremely high design flexibility to be obtained together with the direct integration of control electronics on the chip.

During the process development, the inventors have addressed a number of problems. First of all, the implemented techniques and the conventional materials employed therein did not enable a structurally integral device to be obtained. The transducer became useless due to detachment and breakage of its structural layers, which were subject to high intrinsic stresses. Furthermore, all conventional materials as utilised therein did not offer any possibility to apply highly selective chemical etching procedures.

The solution of such problems, therefore, enables mechanically valid transducers to be obtained. Use of a special polymer has been introduced, polyamide, in substitution for the more conventional silicon compounds. In the second place, the analysis of the chemical-physical characteristics of the materials and their reaction to thermal treatments enabled to determine the necessary durations and temperatures for the obtainment of films, with moderate and not destructive stresses. Lastly, it has been possible to strenghten the structure by designing a special geometrical shape that, by avoiding a concentration of the stresses to restricted areas of the film, made it possible to uniformly distribute such stresses thereby preventing any weakness point from establishing.

In summary, the utilised techniques and novel material made it possible to realise a structurally integral device having all desired mechanical properties. The obtained device has been successfully tested both in respect of the electrical impedance measurement and in respect of the acoustic signal measurement in reception-transmission.

The process according to this invention has been developed by successfully experimenting the pre-patterning technique for effectively controlling the geometry of the transducer components. In particular, the electrostatic cells were preliminarily shaped in order to achieve an optimum control of the dimensional and geometric features of the individual cells. Novel and not conventional materials never previously exploited in the micromanufacture field have been utilised in this process. Particular relevance is to be attributed to utilisation of low temperature evaporate silicon monoxide as a structural layer to form the side supports of the membranes, also designated hereinafter as "rails". In view of the low temperature deposition technique, it is perfectly compatible with the photoresist as needed for the subsequent lifting removal or simply lift off operation, as well as with the organic material utilised as sacrificial layer. On the other hand, the lift off technique offers simplicity and unexpensiveness advantages in the process exploitation. The polyamide utilised as sacrificial layer enables an exceptional chemical etching selectivity to be obtained in respect of the material by which the transducer is made, thereby allowing to maintain the characteristic properties of the structural layers. The mechanical properties of the silicon nitride film grown by a PECVD technique appear to be easier to be controlled. A particular technique has been established to remove the sacrificial layer in order not to cause the adhesion of the structural layer to the substrate (stiction).

Electrical impedance measurements have been carried out on the so realised devices and a mechanical resonance in the air at 5 MHz has been evidenced.

In conclusion, the characteristics of the process according to this invention are the realisation of a pre-patterning procedures for the cavities, the utilisation of silicon monoxide to form the rails, the utilisation of a PECVD reactor for deposition of the layer that forms the membranes and the utilisation of chromium or of a polymer, namely a polyamide, as a sacrificial layer, which enable to planarise the surface upon which the silicon nitride will be subsequently deposited. By these features the presence of a not planar membrane structure, with consequent easy breakage at the edges, are avoided. The pre-patterning step is very important because if offers a valid stoppage to the chemical attack, or etch stop, on releasing the membranes and the chromium or the polymer are easily workable by the usual micromanufacturing techniques on silicon. The high process versatility is made possible in view of the fact the chemical etch utilised for removal of the chromium or the polymer, offers a 100% selectivity in respect of the utilised materials, such as the silicon nitride, the silicon monoxide and the silicon itself. By this procedure, the materials by which the transducer will be effectively made are in no way deteriorated, thereby maintaining all their quality levels in respect of strength and density. The apertures or vias for etching the sacrificial layer are realised by means of a lithographic process and are optimised so as to be subsequently closed in the final stage again by means of a lithographic process.

A close study of the stresses under which the silicon nitride is grown in the PECVD reactor and thermal treatments have been designed to control such stresses, in order to realise membranes having the desired mechanical properties to optimise the performances of the transducer. The analysis of the stress has further been performed by considering that silicon monoxide is utilised as support for the silicon nitride, so that the mechanical interactions between these two materials, that are in reciprocal contact during the annealing procedure, have been investigated.

A further result achieved by this invention in that a capacitive transducer cMUT of a new kind has been realised, comprising an array of suitably parallel to one another connected, electrostatic cells, having an interelectrode spacing noticeably reduced with respect to the cMUT transducers of the previous generations. This result has been made possible by realising the lower metallisation of the device on the upper side of the starting substrate just under the cavities and the membranes, thereby enabling the distances between lower and upper electrodes to be reduced by an amount substantially equal to the substrate thickness. In view of this reason, a novel technologic process has been designed for manufacturing a transducer adapted to operate in more efficient manner and at higher frequencies as well as with reduced parasitic capacitances in comparison to previously realised devices.

As an example of design flexibility offered by this technology, the possibility to realise electrostatic cells having even relatively large dimension, aimed at realising a single array with components of different dimensions is to be mentioned. This technique enables to carry out a simultaneous scanning operations on layers arranged at different depths as well as the three-dimensional reconstruction in real time of the ecographic image, even if the application of the transducers according to this invention is not exclusively restricted to this field.

This invention will be now described by way of illustration, not by way of limitation, according to its preferred embodiments, by particularly referring to the Figures of the annexed drawings, in which:

FIGS. 1A–1H and 1J–1N show the steps carried out in a first preferred embodiment of the method according to this invention;

FIG. 6 is a three-dimensional view of the detail of FIG. 4 after chemical treatment;

FIG. 7 is an upper plan view and a cross-section view of the detail FIG. 6;

FIGS. 8A–8C show the steps carried out in stage B of a second preferred embodiments of the process according to this invention;

In the following description, the same reference numerals will be used to designate the same elements in the Figures.

Figure 1G:
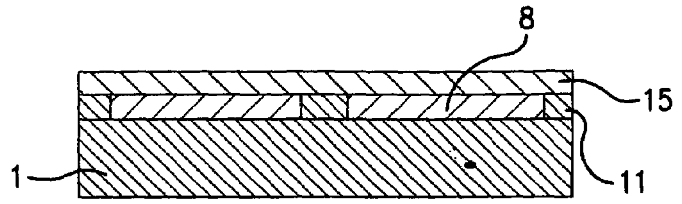

In a first preferred embodiment of the process according to this invention, 340 devices corresponding to twelve different geometries are manufactured on a single wafer. The realisation of a so large number of devices per wafer is possible in view of the fact that each device has a surface area of only 3 $mm^2$.

The circular shape of each individual electrostatic cell has been selected since this shape optimises the characteristics of the generated acoustic ultrasonic filed to the best.

In Table 1, the main geometrical characteristics of the twelve realised typologies are shown.

The process according to this invention starts from a silicon wafer grown according to the Czochralski methods, or CZ silicon, p-type doped with boron (density: $10^{17}$ $cm^{-3}$), having a resistivity of about 0.1 Ω.cm with crystallographic orientation <100>. The side of the wafer on he process is carried out is lapped.

TABLE 1

| Type | Rail minimum dimension ($10^{-6}$ m) | Number of Membranes per device | Membrane diameter ($10^{-6}$ m) | Type of vias arrangement | Diameter of vias ($10^{-6}$ m) |
|---|---|---|---|---|---|
| 1 | 10 | 1512 | 40 | A | 6 |
| 2 | 10 | 1512 | 40 | B | 4 |
| 3 | 10 | 1512 | 40 | C | 8 |
| 4 | 10 | 1512 | 40 | D | 4 |
| 5 | 10 | 1512 | 40 | E | 4 |
| 6 | 10 | 1512 | 40 | F | 4 |
| 7 | 10 | 1512 | 50 | A | 6 |
| 8 | 10 | 1512 | 50 | B | 4 |
| 9 | 10 | 1512 | 50 | C | 8 |
| 10 | 10 | 1512 | 50 | D | 4 |
| 11 | 10 | 1512 | 50 | E | 4 |
| 12 | 10 | 1512 | 50 | F | 4 |

The first step to be carried out is the application of a polyamide layer which will subsequently suitably etched in order to realise the layout that should receive the support rails of the structural layer. The polyamide layer forms the sacrificial layer and its thickness identifies the distance by which the membrane will be spaced from the substrate upon being released therefrom.

In particular, the polyamide represents the end treatment stage of a monomer solution that is applied to the wafer by means of a high speed centrifugation technique or spinning. Two successive thermal treatments are subsequently carried out in order to promote the polymerisation reaction which results into a product designated as polyamide.

The thickness of the layer depends on the rotation speed and decreases after the polymerisation process is completed.

The polyamide utilised herein (N-methyl-2-pyrrolidone) is a polymer manufactured by Olin Microelectronic Materials having trade name Probimide 112A selfpriming cat 851089.

The preliminary treatment of the wafer comprises a cleaning step to remove the atmospheric dust, performed by putting the wafer under a jet of deionised running water and then drying it by a jet of nitrogen. More adherent particles are removed by imaging the sample into an acetone bath in a tank run through by ultrasonic waves, in order to exploit the cavitation effect. A cleaning operation particularly aimed at removal of organic residuals and fat acids can be carried out by immersion into a bath formed by a solution comprising 70% sulphuric acid ($H_2SO_4$) and 30% hydrogen peroxide ($H_2O_2$).

After rinsing and drying the sample, a last dry cleaning step can be carried out by utilising oxygen plasma.

All water residuals, which could jeopardise the adhesion of the polymer to the surface, could be removed by means of a drying step carried out by heating the wafer in a furnace at 150° C. for 20 minutes.

The wafer in then arranged on the circular plate which the spinner is provided with, about 3 ml polyamide are put at the central area of the plate and this plate is then rotated, initially at low speed, until the polyamide reaches the edge of the wafer, then speed is increased up to 4000 rpm during a total time of 120 seconds. The so prepared wafer is then treated in a furnace at a temperature of 120° C. for 30 minutes, in order to evaporate the solvents having the monomers dissolved therein. The last preparation stage of the layer to be subsequently utilised as a sacrificial layer consists in the polymerisation process. The sample is arranged upon a quartz support in horizontal position within a metal wall furnace, immersed in a nitrogen flow. The thickness measured after the polymerisation stage is about 890 nm, which is higher than the 500 nm limit as required by the specifications of the preferred embodiment of the process. A thinning stage should subsequently be carried out by means of a dry etching operation in RIE with a $CF_4$ flow rate of 12.6 sccm (standard cubic centimetres per minute), an $O_2$ flow rate of 60 sccm, under a pressure of 5.3 Pa, a power of 100 W and a via voltage of 200 V: the removal rate is found to be 2.5 nm/s.

The lower electrode of the reactor should be protected by means of a large silicon wafer, because it enables a higher etching spatial uniformity to be achieved. The etching time is of about 150 s.

The product obtained at the end of the above operations is shown in FIG. 1A where the substrate 1 and the polyamide layer 2 cm can be observed.

The pre-patterning operations consist in etching the polyamide layer 2 in order to form islands corresponding to the membranes that form the sacrificial layer. The etching procedure is carried out as a dry etching operation in a suitable plasma, by utilising an optical resist as a masking layer. A positive photolithographic process is utilised in order to define the areas to be etched away in the polyamide film.

The mask utilised in the optical lithographic process is realised by means of an electronic lithographic process. It is possible to realise on the same mask six different device typologies in respect of the via arrangement, as it is shown in FIGS. 2A–2F.

Figure 2A:
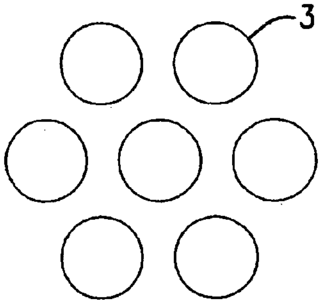
FIGS. 2A–2F show six mask typologies as utilised for definition of the membranes in the process according to FIGS. 1A–1H and 1J–1N.
Figure 2B:
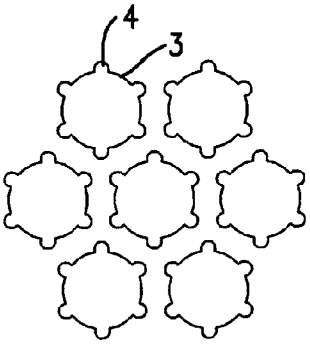

The typology of FIG. 2A is designed to realise a single via for each membrane 3 at its centre area and it is almost designed to manufacture a process control device. The other typologies provide for realising the vias outside the circular membrane 3, in order to disturb the circular geometry to the minimum possible extent. As regards the typologies shown in FIGS. 2B, 2D and 2E, the vias are positioned within the outwardly protruding lunettes 4. In the typology of FIG. 2F the vias should be arranged in order to be superimposed on the thin channels 5 protruding from membrane 3.

Figure 2C:
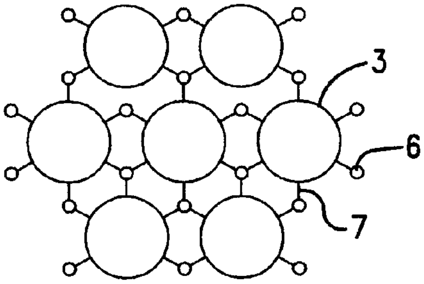
Figure 2D:
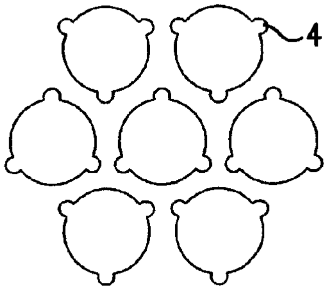
Figure 2E:
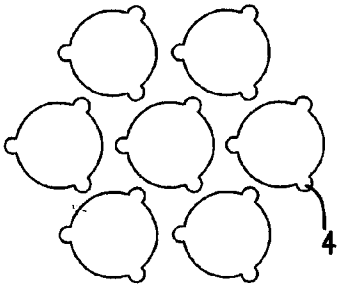
Figure 2F:
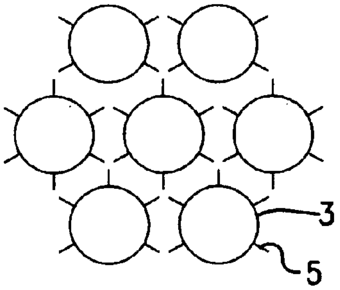

The typology of FIG. 2C provides for arranging the vias 6 completely outwardly of membrane 3 and the chemical etch of the sacrificial layer reaches the area corresponding to membrane 3, namely the air gap, through the connection channels 7. This geometry in addition to being scarcely perturbative enables optimum results to be obtained particularly at the stage in which the vias are to be closed, since the filling of the vias is not critic to membrane vibration, because it is sufficiently spaced apart and not tangent as in the other typologies.

Figure 3:
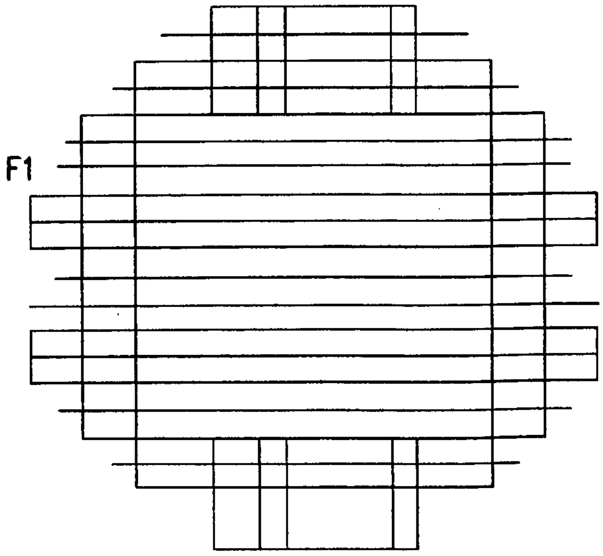
FIG. 3 is an upper plan view of the silicon semiconductor substrate as utilised in the process according to FIGS. 1A–1H and 1J–1N.

A frame for separating the 340 transducers has been realised in order to aid performing the final cutting operations. The frame layout is shown in FIG. 3, where the devices with membranes of 40 μm diameter have been realised in the upper half section, while the devices with membranes of 50 μm diameter have been realised in the layer half section.

At the end of the pre-patterning stage, polyamide islands having the shapes illustrated in FIGS. 2A–2F are obtained. By referring to FIG. 1B, polyamide islands 8 can be observed, such islands being protected by optical resist masks 9, between which the layout 10 that will be filled by rails of silicon monoxide has been etched. The etching operation of the polyamide takes place in RIE in order to obtain a more vertical removal with respect to the wet etching operations. The etching operation is carried out with a formulation as already defined in connection with the thinning stage of the polyamide.

The etching time for removing 480 nm of polyamide is of about 156 s and it should be carefully controlled, because this formulation entails a silicon removal and, therefore, the risk to etch the substrate is run. The thickness control is effected by means of a profilometer. The optical resist masks 9 are not removed.

The rails are realised by thermally evaporated silicon oxide. The choice of this material is suggested by the fact that, since a material is to be deposited upon the optical resist in view of the subsequent lift off step, it is necessary to carry out a low temperature process in view of the scarce heat resistance of such material. No particular treatment of the wafer is carried out before evaporation of the silicon oxide, besides the usual removal operation of the dust particles in deionised water and in nitrogen flow. The thickness of the evaporated silicon oxide depends on the polyamide thickness existing on the sample, because both the oxide and the polyamide are to be levelled in order to obtain as much planar membranes as possible. The deposited thickness is equal to 500 nm.

After this stage is completed, the situation is as shown in FIG. 1C, in which the rails 11 of silicon monoxide and the silicon monoxide areas 12 overlapping the optical resist masks 9 are shown.

The subsequent step provides for removing the silicon monoxide areas 12. The sample is immersed in acetone in order to dissolve the resist masks 9 by removing then the superimposed monoxide areas 12.

The amount of silicon monoxide to be removed is noticeable and, therefore, a good resist dissolution efficiency is necessary. A detail of FIG. 1C is shown in FIG. 1D to evidence that etching of resist by acetone starts from side direction. Therefore, it is necessary that the thickness of said resist masks 9 be sufficient, in respect of the monoxide amount to be evaporated, not to allow the side of said masks 9 to be covered. However, should the vertical side of the concerned resist be completely covered by monoxide, it would anyway be possible to remove it by other techniques.

After a few minutes of treatment with acetone, possibly with ultrasonic aid, the situation shown in FIG. 1E is reached.

The enlargement illustrated in FIG. 1F shows the unavoidable monoxide residual 13, also called "bind wing", remaining at the monoxide-polyamide interface. This is a typical secondary effect of this technique and it is undesired in view of the fact that it represents a breakage point for the membrane to be superimposed to it.

Figure 4:
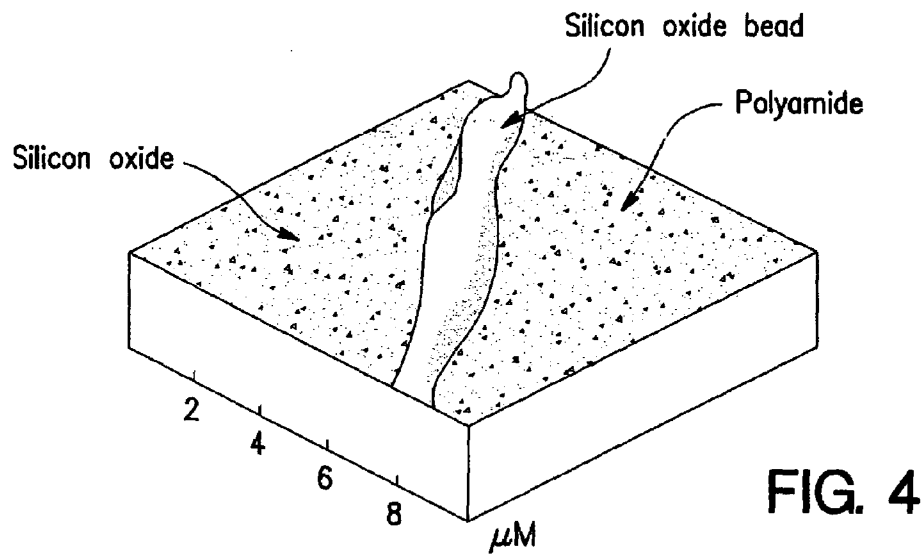
FIG. 4 is a three-dimensional view of a detail of FIGS. 1E and 1F.

FIG. 4 illustrates the three-dimensional reconstruction of the monoxide-polyamide interface profile based upon a surface scan obtained by means of an atomic force microscope or AFM.

Figure 5A:
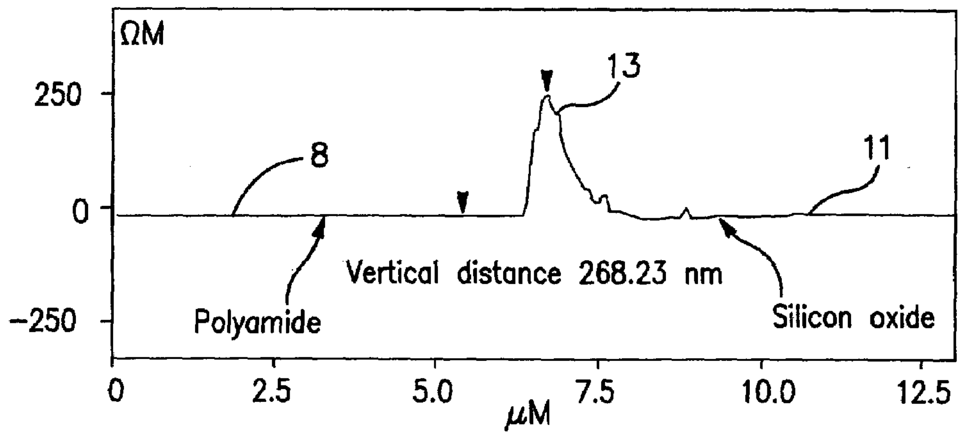
FIG. 5 is an upper plan view and a cross-section view of the detail of FIG. 4.
Figure 5B:
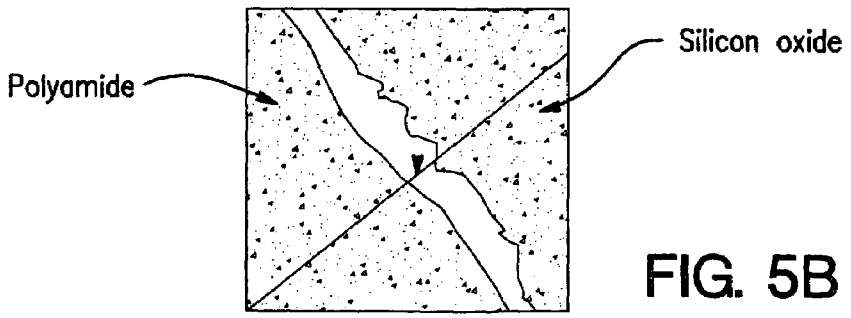

FIG. 5 illustrates the cross-section of the same profile and the measurement of the differences in height existing between the polyamide island 8, the monoxide rail 11 and monoxide residual 13.

Aiming at reducing the defects existing at the edges, it is suggested to operate with a wet etching operation in 5% solution of hydrogen fluoride (HF). The immersion time is very short, about 2 s, because the silicon monoxide forming the rail member 11 should not be etched away.

Aiming at protecting the polyamide in respect of the hydrogen fluoride, the immersion is performed before carrying out the lift off operation by means of an acetone bath, in order that the resist layer and the silicon oxide protect the underlying polyamide. This measure further improves the resist dissolution rate and accuracy in the subsequent acetone bath, because the vertical sides will be more exposed to the etching solution.

By referring to FIG. 6, it can be observed that the wet etching operation nearly completely eliminates the bind wing formation 13, but it generates a groove 14 caused by penetration of the hydrogen fluoride to the monoxide-polyamide interface.

As it is shown in FIG. 7, the depth of the groove is not amenable to raise problems because the 500 nanometres of silicon nitride to be deposited thereon will be sufficient to fill it up.

The drawback caused by said groove is overcome in a second preferred embodiment of this invention, in which the stage providing for realisation of the intermediate product comprising polyamide islands 8 and silicon monoxide rails 11 is different from the one described by referring to FIGS. 1A–1E. By referring to FIGS. 8A–8C, it can be observed that said rails 11 are deposited before depositing said sacrificial polyamide, by means of a carpet deposition process extended to the whole wafer, followed by pattern definition by means of a plasma etching operation (FIG. 8A). Polyamide is subsequently deposited to cover the wafer (FIG. 8B) the liquid phase deposition and the subsequent polymerisation or curing operation make the surface profile gradual, but sill sufficiently conforming to the underlying topography relating to the monoxide rails 11. Lastly, a planarisation step is carried out by means of a chemical-mechanical polishing operation, by utilising a silica particle solution in alkaline environment, by rubbing the wafer against a hard surface, preferably a glass surface. The surface turns out to be completely planarised at the end of the polishing procedure, without formation of grooves at the edges of the rails 11 (FIG. 8C).

By referring to FIG. 1G, it can be observed that layer 15, by which said membranes are formed, is realised by silicon nitride deposited by utilising a PECVD reactor. The thickness of the deposited film is of about 500 nm. A good adhesion is achieved between the silicon nitride and the monoxide. A preliminary cleaning operation is carried out in acetone for 300 s followed by rinsing in deionised water.

In comparison to films grown by a LPCVD procedure, a PECVD procedure enables films to be deposited at low temperatures, lower than 400° C., and with mechanical characteristics variable within an extended range. The deposition of films of high quality at low temperatures allows to utilise, for the sacrificial layer, materials that can be removed very rapidly and with very high selectivity in respect of silicon nitride, such as polyamide or optical resist.

The control of the growing parameters of the silicon nitride films is essential for the obtainment of efficient membranes.

Laboratory tests have evidenced the problem of the mechanical compression stress of the silicon nitride films grown by means of a PECVD reactor. It was not possible to directly grow a silicon nitride film affected by tensile stress. The growing parameters adapted to minimise the compression stress are shown in Table 2.

TABLE 2

| | |
|---|---|
| RF Frequency | 13.56 MHz |
| Power | 10 W |
| Temperature | 650 K |
| Pressure | 70 Pa |
| Silane flow | 11 sccm |
| Nitrogen flow | 170 sccm |
| Helium flow | 220 Sccm |

Figure 9:
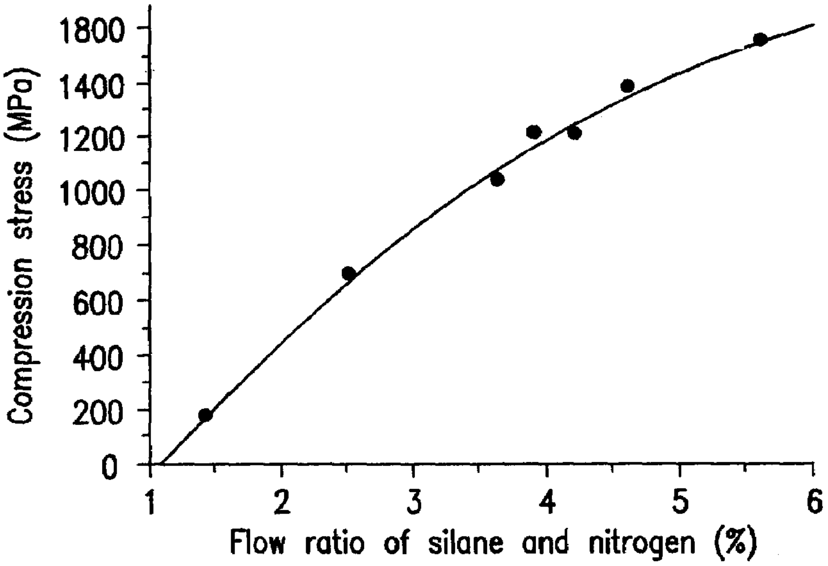
FIG. 9 shows a diagram graphically representing the compression stress of the membranes manufactured by the process according to this invention.

FIG. 9 shows a diagram of the compression stress behaviour as a function of the silane/nitrogen ratio according to the measurements affected.

When the flow rate of silane is decreased with respect to the flow rate of nitrogen, a reduction of the compression stress can be observed. The large amount of nitrogen in the film, however, makes the film more fragile.

Figure 10:
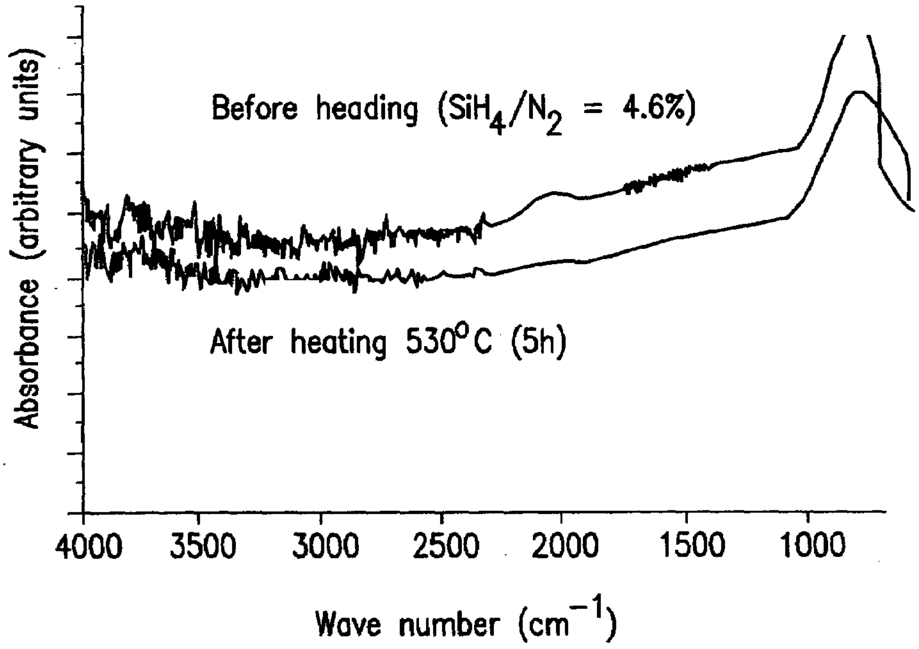
FIG. 10 shows a diagram graphically representing the absorption spectrum of the membranes manufactured by the process according to this invention.

The mechanical stress in the membranes can be modified by means of heat treatments carried out after the film deposition. Heating the silicon nitride to temperatures higher than 500° C. causes thickening of the film due to hydrogen desorption with formation of linkages between silicon and nitrogen. The reduction of the linkages Si—H (about 2100 $cm^{-1}$) clearly appears from the absorption spectrum of FIG. 10. This spectrum is obtained by infrared spectroscopy or FTI, and it results from subtraction of the absorption of a silicon sample with 400 nm nitride and of the absorption of a clean silicon sample. The noise encountered in connection with wave numbers higher than 2200 $cm^{-1}$ is due to variations in air absorption between the acquisitions.

Figure 1H:
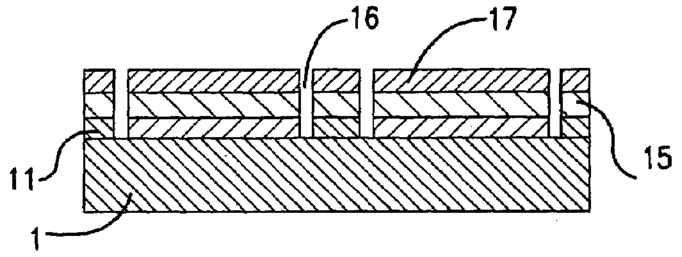

By referring to FIG. 1H, the holes through which the etching operation of the silicon nitride is carried out by means of a RIE etching procedure, aimed at realising the vias 16, are defined by a subsequent lithographic operation. In particular, the etching operation is carried out with a $CHF_3$ flow rate of 50 sccm, an $O_2$ flow rate of 8 sccm, a pressure of 7.1 Pa, a power of 180W and a bias voltage of 260 V: the removal rate of the silicon nitride 15 turns out to be 0.67 nm/s, while the removal rate of the optical resist 17 is of 0.5 nm/s.

The etching time to realise a through hole in a standard membrane of 500 nm is of about 600 s, but aiming at assuring that said vias 16 reach the sacrificial layer 8, such duration is extended to 900 s, without causing any damage, also keeping in mind that said sacrificial layer will be eventually removed.

Figure 1J:
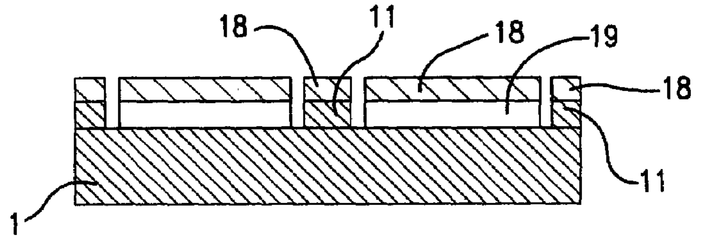

It is subsequently proceeded to a membrane releasing step. By referring to FIG. 1J, at the end of the polyamide sacrificial layer 8 removal, the silicon nitride membranes 18 are suspended on an air gap 19 of 500 nm and are sustained by rails 11 of silicon monoxide. The chemical etching step on the polyamide is carried out preferably by immersion in a 7:3 solution of sulphuric acid ($H_2SO_4$) and hydrogen peroxide ($H_2O_2$) that strongly attacks any compound, particularly the polyamide, by means of a highly exothermal reaction, rapidly reaching 353K. The selectivity in respect of silicon nitride, silicon oxide and silicon itself amounts to 100%.

The complete removal of the sacrificial layer is carried out in just 2400 s time and the 100% selectivity assures a perfect integrity of the silicon oxide and silicon nitride films.

Figure 11:
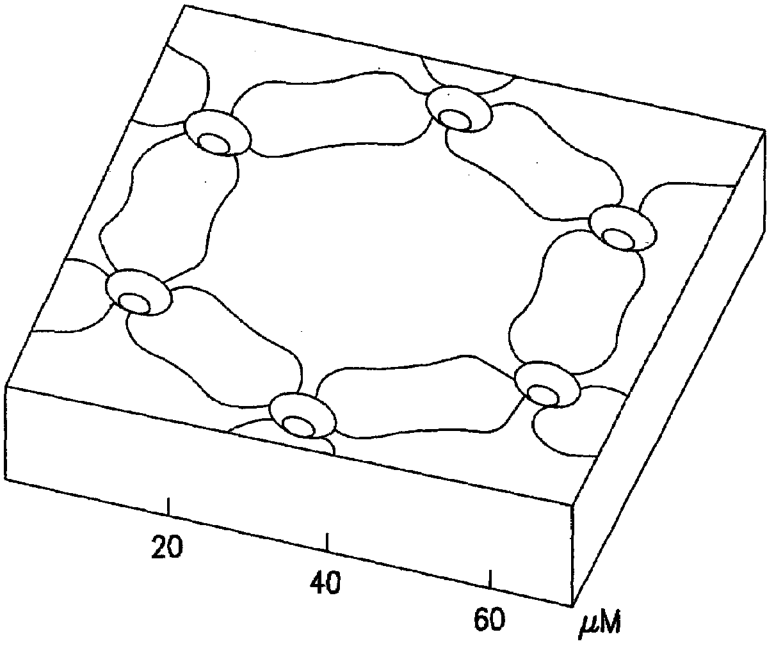
FIG. 11 is a three-dimensional view of a membrane manufactured by the process according to this invention.

Should no heat treatment be carried out, the intrinsic compression stress under which the PECVD nitride grows immediately appears on releasing the membranes. The effect observed is a camber in the membrane due to the fact that the silicon nitride film has a tendency to increasing its surface and the membranes engaged with the rail have a tendency to explode upwardly. The circular geometry of the cells, the arrangement of the holes, the dimensions of the membranes and the treatments carried out after the lift off operation synergistically contribute not to fragment the membrane even under a compression stress. FIG. 11 shows the three-dimensional reconstruction effected by said AFM for a membrane according to typology of FIG. 2C, subjected to a compression stress after release, which makes it cambered upwardly.

Figure 12:
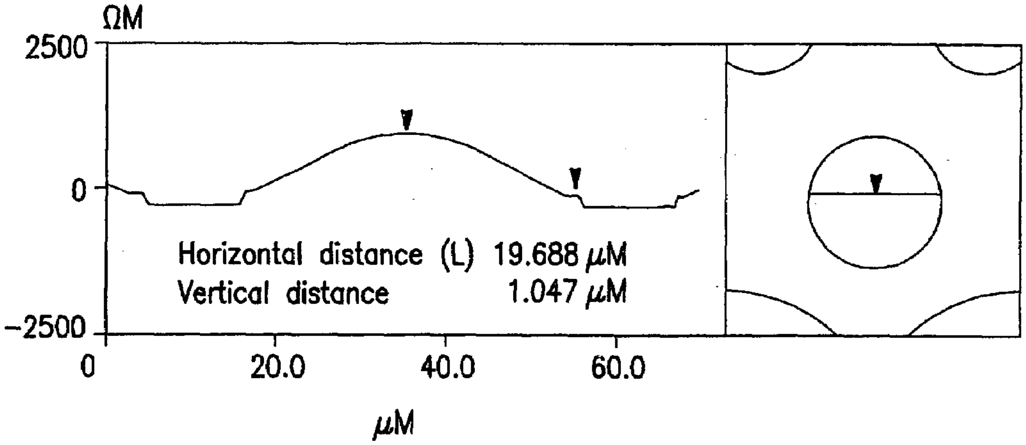
FIG. 12 is an upper plan view and a cross-section view of the membrane of FIG. 11.

FIG. 12 shows the cross-section of the membrane of FIG. 11: the camber of the membrane is of about 1 nm which, when compared to 40 nm diameter of the membrane, does not appear to be so relevant. Anyway, in view of assuring a correct operation of the transducer, a tensile stress appears to be preferable with respect to a compression stress.

When membranes having a higher Young's modulus are desired, by increasing the silicon amount contained in the nitride film, an increase in the compression stress is obtained, which could cause breakage of many membranes.

In the preferred embodiment of the process according to this invention, the stress is gradually relieved by means of thermal treatments in which the sample is heated to a temperature in the range of 490° C. to 530° C., preferably a temperature equal to 510° C.

Figure 13A:
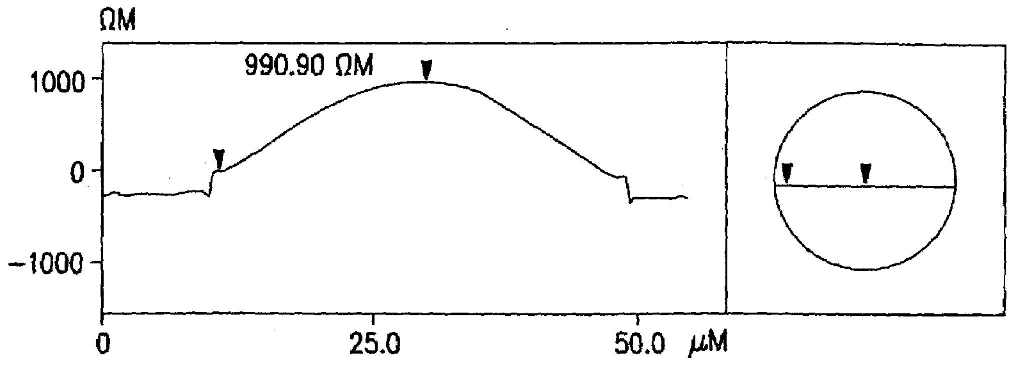
FIG. 13 is an upper plan view and a cross-section view of a membrane manufactured by the process according to this invention at three successive times.
Figure 13B:
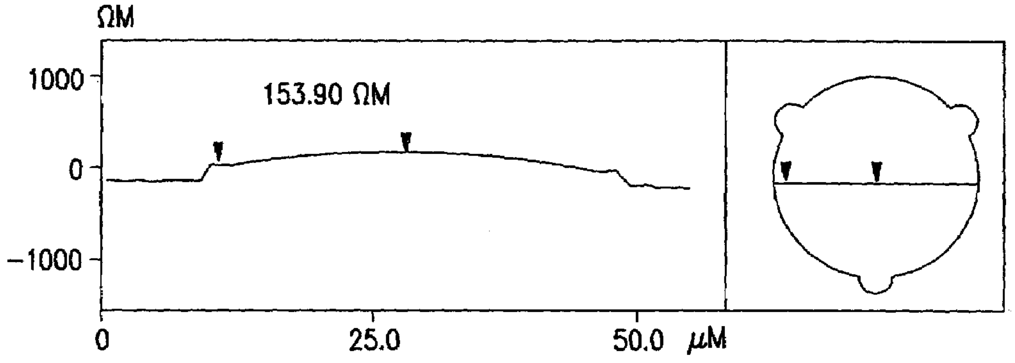
Figure 13C:
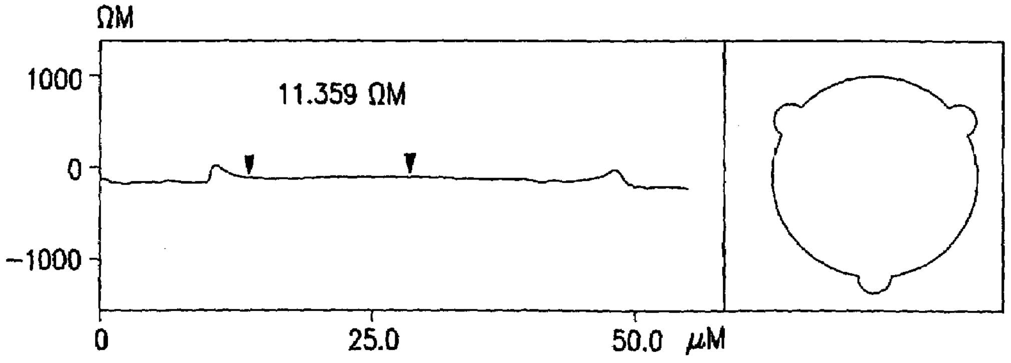

FIG. 13 shows the variation of the membrane profile achieved by subjecting the concerned device to two thermal annealing treatments, each extended to a 5 hour duration. The first annealing treatment is carried out before the removal of the polyamide sacrificial layer, thereby reducing the compression stress and also making it not destructive during the release step of the membranes.

In particular, the duration of the first thermal treatment can be such as to completely consume the polyamide material, thereby making the removal to be effected by chemical etching redundant. Further thermal treatments can be carried out in order to further reduce the intrinsic compression stress and to introduce an intrinsic tension stress into membranes.

Furthermore, the annealing treatments allow to achieve a very high design flexibility, also in terms of geometry and dimensions of the membranes.

After release of the membranes, the vias can be closed by means of a silicon monoxide deposition, having a thickness equal to the thickness of the air gap 19, and of an optical lithography operation. Lastly, a metallisation of both sides of the wafer is carried out.

Figure 1K:
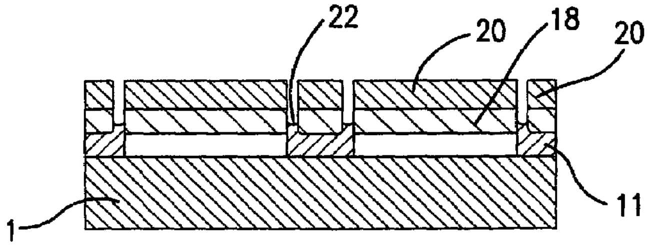

By referring now to FIG. 1K, it can be observed that the closure of the vias takes place as a column filling thereof by utilising silicon monoxide that forms the stoppers 22. The thickness of the monoxide layer 20 as deposited ought to be sufficient to form stoppers 22 reaching the underlying nitride 18. In view of the above, it is necessary to deposit at least a thickness equal to the air gap 19, which means 500 nm, in the preferred embodiment, and, obviously a higher thickness is usually deposited for safety reasons, equal to 700 nm. The deposition technique is a low temperature evaporation based upon heating by Joule's effect a crucible containing silicon monoxide grains.

Figure 1L:
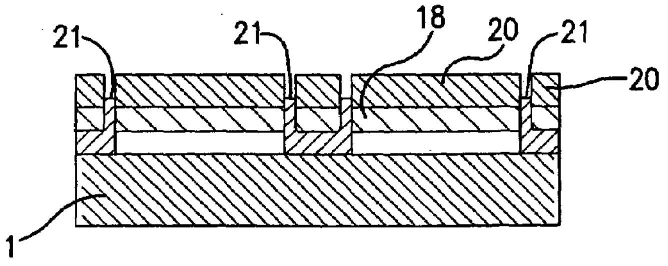

By referring to FIG. 1L, the monoxide layer 20 deposited on membranes 18 should be removed because otherwise it would not allow a correct operation of the transducer. The removal is carried out by means of an optical lithographic operation with subsequent etching operation in RIE. The optical lithographic procedure is needed because it is. necessary to create a mask layer 21 consisting of an optical resist, suitably shaped in order to protect said stoppers 22 from the etching agent acting on the silicon monoxide, leaving the monoxide 20 superimposed to the membrane 18 exposed. Preferably, the thickness of the resist is 1.5 nm. Etching of the silicon monoxide is carried out in RIE according to the formulation already discussed in respect of the etching operation performed on silicon nitride for realising the vias. It is necessary to remove 700 nm of silicon oxide and, therefore, considering that the etching rate is of about 0.8 nm/s, the etching time is of about 875 seconds. The utilised formulation slowly removes also said optical resist, but this does not raise any problem, because it has a endurance well beyond the duration of the etching operation.

The utilised formulation is not selective in respect of the underlying silicon nitride, so that, during the etching operation, it is necessary to control the oxide removal status, in order to stop the procedure as soon as it is finished.

Figure 1M:
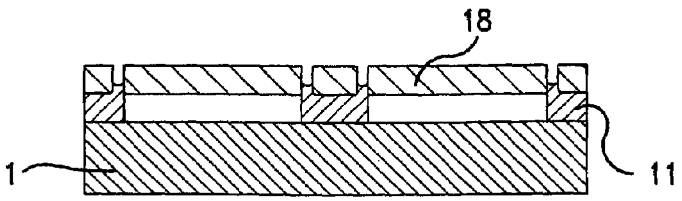

Subsequently, the residual resist is removed by an oxygen plasma in RIE, under an $O_2$ flow rate equal to 67 sccm, a pressure equal to 5.3 Pa, a power equal to 100 W and a bias voltage equal to 200 V. Alternatively, the sample can be immersed in acetone for a few minutes and then rinsed in deionised water. At the end of the resist removal operation, the product shown in FIG. 1M is obtained.

Should it be desired to make the electric control of the transducer possible, it will be necessary to metallise the membranes 18 and the back surface of the wafer 1.

Figure 1N:
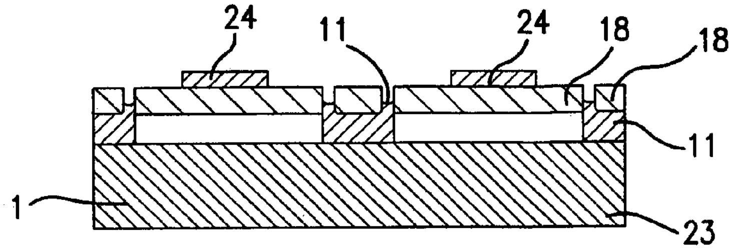

By referring to FIG. 1N, the back surface of the wafer is metallised by deposition of an aluminium film 23 of 150 nm thickness. The surface to be metallised is of not-lapped silicon. Such surface should be cleaned and not oxidised, in order to guarantee a good adhesion of the film as well as a good ohmic contact. At the end of the process, the wafer is heated to 650K for 1800 seconds in order to improve the ohmic contact, in a steel furnace, under a nitrogen flow rate of 30 sccm.

On the other side of the wafer 1, aiming at reducing the parasitic capacitances of the transducer, only membranes 18 are metallised. Only connections between the electrodes are provided corresponding to the rails 11, while the contact with the external circuit is realised by means of a suitable pad. The metallisation pattern is realised by means of an optical lithographic process, with utilisation of a mask realised by an electronic lithographic process. The aluminium film applied for metallisation of the membranes is deposited by sputtering. The metal layer patterning operation is carried out by means of a further optical lithographic process, with utilisation of a mask realised by means of an electronic lithographic process, thereby obtaining the metallisation areas 24 of the membranes 18.

In a third embodiments of the process according to this invention, by referring to FIG. 14 to 22, the main improvements are connected with utilisation of new materials to realise the lower metallisation and the sacrificial islands of the transducer.

For realisation of the lower electrodes, it is suggested to utilise chromium as conductive material rather than aluminium, as always utilised in the prior art devices, even if chromium has a resistivity of $12.7\times10^{-8}$ Ω.m. Such choice is determined by the fact that aluminium is not adapted to withstand the deposition temperatures of the subsequent layers which the device consists of. Furthermore, aiming at reducing the parasitic capacitances established in the transducer, the chromium layer as deposited is suitably patterned by means of an optical lithographic process, in order to obtain a structure exclusively entailing the metallisation of a restricted area corresponding to the cavities or hollow chambers and to the membranes. The upper metallisation is realised by deposition of an aluminium layer, rather than chromium, in view of the fact that the latter would grow with a highly tensile mechanical stress, which sometimes could be destructive for the membranes. The aluminium film is subsequently treated in order to define the metallised areas on the membranes and their interconnections, positioned with a complementary configuration with respect to the interconnections of the lower metallisation, in order to limit the incidence of parasitic capacitances.

Another noticeable improvement is related to utilisation of chromium as sacrificial material in substitution for the most common silicon compounds. The chemical etching operation utilised for its removal has a selectivity of 100% in respect of the other materials utilised therein, such as the silicon nitride, the silicon monoxide and the silicon itself, thereby assuring a perfect control of the active region of the transducer. In this way, the materials by which the device will be effectively formed are in no way deteriorated, thereby maintaining all their performances in respect of resistance and density. In fact, as it has been already evidenced, should a material having a low etching selectivity level with respect to the structural layers be utilised, also the membranes and the walls would be etched during removal of the sacrificial material, thereby modifying the dimensions of the cells and the thickness of the membranes themselves, with resulting variation of the characteristic properties of the transducer.

Also in this third preferred embodiment, the pre-patterning technique is exploited by defining, by means of a photolithographic procedure, the sacrificial islands before deposition of the membranes, in order to guarantee a micrometric definition of the device geometry. The hollow chambers or cavities upon which the membranes are suspended effectively represent the active regions of the transducer. Their geometry and dimension represent the main factors by which the performances of the device are characterised.

Figure 14:
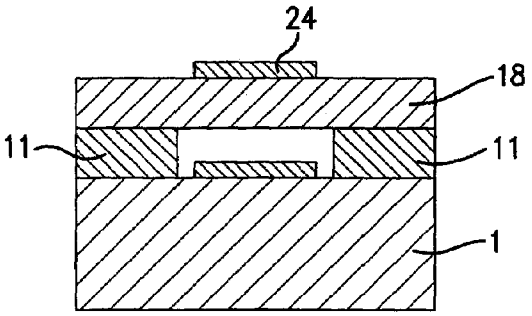
FIG. 14 shows a microcell of the transducer manufactured by a third embodiment of the manufacturing process according to this invention.

In particular, FIG. 14 shows a microcell of the transducer manufactured by means of the third embodiment of the manufacturing process according to this invention. In this case, the lower metallisation 25 is directly realised on the upper surface of the wafer, just under the membranes 18 and the corresponding cavities, thereby reducing the distance between stationary lower electrodes and the mobile upper electrodes by a thickness substantially equal to the thickness of substrate 1, equal to about 380 nm.

The third embodiment of the manufacturing process according to the invention utilises 3" p-type doped silicon wafers, having a resistivity of about 0.1 Ω.cm with crystallographic orientation <100>.

A number of 340 devices are micromachined on a single wafer, each of which is characterised by 1512 membranes. A so high number of devices is made possible by the small area engaged by each of them equal to 3 $mm^2$. Each membrane has a circular type shape realised by referring to polygons of 16 sides. Such a geometry perfectly matches the characteristics of the acoustic field generated. The individual membranes appear to be arranged according to a configuration of a matricial type with a minimum distance of 10 nm from one another.

One half of the devices realised on the wafer are formed by membranes each having a diameter of 40 nm, while the devices of the other half are formed by membranes having a greater diameter equal to 50 nm.

As far as each device is concerned, reference is made to electrostatic cells having geometric shapes realised, in respect of the holes provided for etching the sacrificial layer and the connection bars, according to the five different typologies shown in FIGS. 2B, 2C, 2D, 2E and 2F. In total there are ten different typologies realised by exploiting the two different dimensions of the considered membranes.

Figure 15A:
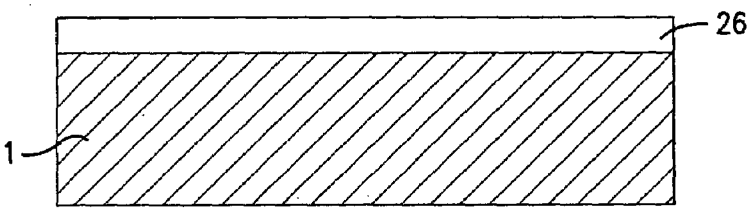
FIGS. 15A–15H and 15J–15N show the steps carried out in a third preferred embodiments of the process according to this invention.

By referring to FIG. 15A, according to the third embodiment of the process of this invention, an insulating layer 26 of thermal silicon dioxide $SiO_2$ is deposited to isolate the starting silicon substrate 1 from the lower metallisation.

Figure 15B:
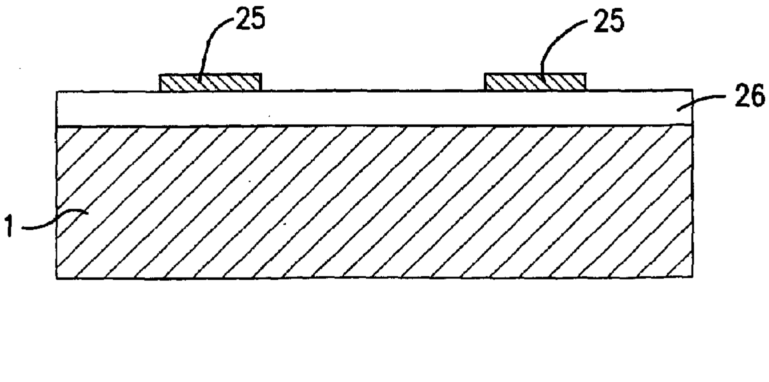

By referring to FIG. 15B, the process provides for realising the lower electrodes 25. The lower metallisation is realised by depositing a uniform chromium layer by evaporation. The chromium film is subsequently patterned by means of an electronic lithographic process aimed at imparting a particular geometric shape to the lower metallisation. The need to reduce the parasitic capacitances of the transducer resulted into metallisation of the membranes 18 only so that the connections between the electrodes 25 are realised by means of suitable conductive paths realised in positions corresponding to the rails 11 and the thickness of which is not higher than 4 nm. The dimensions of the electrodes 25 are selected to optimise the performances of the transducer. They are exclusively realised in the central portion of each membrane 18 so as to increase the ratio between the capacitance modulation and the static capacitance of the device. Due to this reason, the process realises electrodes 25 utilising only 60% of a surface corresponding to the surface of the membranes 18 and with a small thickness if compared to the thickness of the membranes 18. When membranes 18 having diameters of 40 μm and 50 μm are realised, the obtained electrodes 25 have diameters of 24 μm and 30 μm, respectively.

Connection pads are utilised to allow the realisation of an electric contact between the electrodes 25 and the external circuit.

Figure 15C:
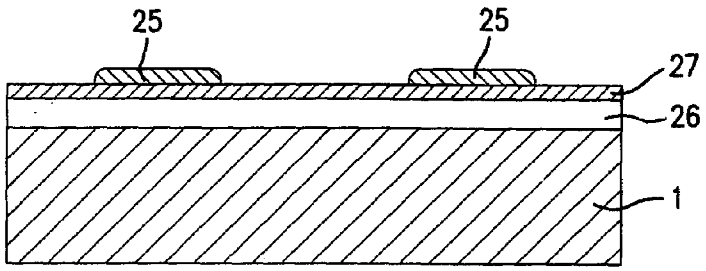

As it is shown in FIG. 15C, the pattern of the lower electrodes 25 and of their related interconnections is protected by means of a film 27 of silicon nitride SiN grown by means of a PECVD technique.

Figure 15D:
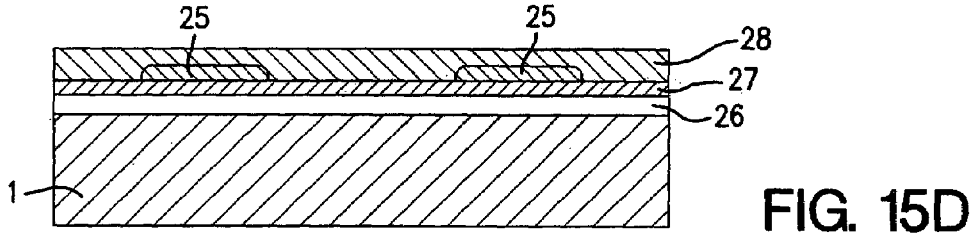

Subsequently, as it is shown in FIG. 15D, a film 28 of chromium is deposited by means of an evaporation technique as a sacrificial material.

Figure 15E:
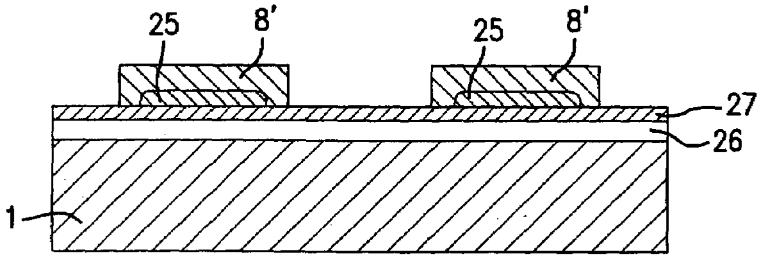

By referring to FIG. 15E, pre-patterning of sacrificial islands 8' is carried out by means of an optical lithographic process, by utilising a suitable mask realised by means of an electronic lithographic process. A subsequent wet etching operation is carried out on said chromium in order to define the regions forming said island 8'. The chromium layer exclusively remains unaltered in regions corresponding to the area by which the cavities (air gap) of the transducer will be characterised. The above said layer 28 defines the thickness of the cavity in the transducer and, therefore, it is a critical variable in designing the performances of the transducers. The resist (not shown) applied upon the islands 8', which is not exposed during the lithographic process, is not removed in order to permit execution of the subsequent step of the process.

In particular, FIG. 18A, 18B, 18C and 18E show the optical microscope images of the chromium sacrificial islands 8' before the monoxide rails 11 are formed, respectively corresponding to the five geometric shapes of the etching holes shown in FIGS. 2B, 2C, 2D, 2E and 2F.

Figure 15F:
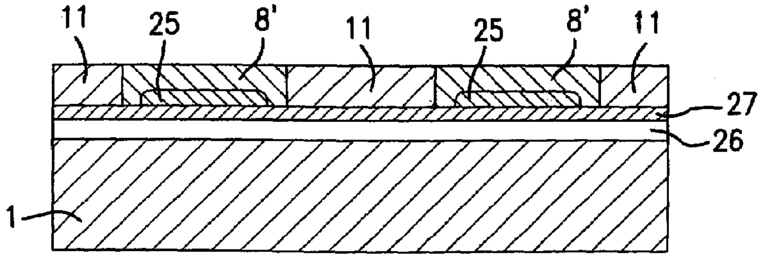

By referring now to FIG. 15F, a layer of silicon monoxide SiO, is deposited by means of an evaporation operation based upon the Joule's effect, in order to realise a planar type structure and to create rails 11 aimed at supporting the membranes 18. The excess monoxide grown upon the islands 8' is removed by means of a lift off process, by dissolving the resist not removed by the previous step, by acetone and ultrasounds.

The thickness of the deposited monoxide is equal to the thickness of the sacrificial islands 8' in order to obtain rails 11 having the same height as the cavities. This enables a subsequent structural layer of the membranes 18 to be deposited upon a planar type surface, thereby assuring a uniform stress distribution in the membranes and avoiding possible breakage points for the membranes themselves.

In particular, FIGS. 19A, 19B, 19C, 19D and 19E show the optical microscope images of the chromium sacrificial islands 8' after the monoxide rails 11 have been created, respectively corresponding to the five geometric shapes of the etching holes shown in FIGS. 2B, 2C, 2D, 2E and 2F.

Figure 15G:
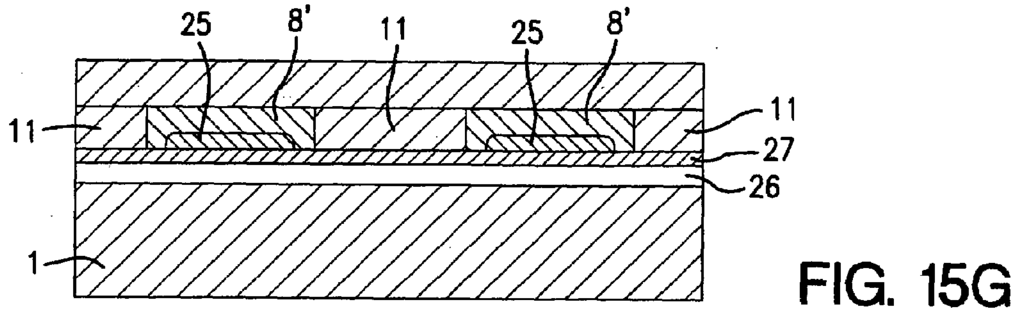

By referring to FIG. 15G, the realisation of the membranes 18 is carried out by depositing a layer 15 of silicon nitride $SiN_x$ by exploiting a PECVD technique. The residual stress of the nitride film 15 can be controlled by varying the plasma frequency, the substrate 1 temperature and the nitrogen and silicon relative concentrations during the deposition process. The intrinsic stress in the silicon nitride membrane 18 has been designed so as to have a scarce tensile character by controlling the radio-frequency power in the PECVD process. The thickness of the film 15 can be controlled in the PECVD process, as well. The stress under which the film 15 is grown represents an essentially important factor in view of the fact that, as previously discussed, the resonance frequency of the membrane 18 depends thereon.

A thermal annealing step of the sample is then carried out in order to reduce the compression stress in the membranes 18, which would cause a subsequent camber effect as well as their breakage after releasing thereof, with conversion of the compressive stress into a weakly tensile stress.

By referring to FIG. 15H, it can be observed that submicrometric apertures 16 (etchant holes) are defined, by means of an optical lithographic process, on the membrane 18 area, in order to enable chromium to be subsequently removed from the underlying sacrificial islands 8'. The above mentioned apertures 16 are provided in perimetral positions on each individual membrane according to five different typologies as shown in FIGS. 2B–2F, which assure an efficient etching of said sacrificial islands 8' as well as an excellent mechanical stability of the structure.

A mask with a pattern of holes 16 having a design diameter of 4 nm is realised by means of an electronic beam lithographic process. The dimensions of the vias 16 should be small, in order to enable the holes to be closed and the cavities be sealed, but, on the other hand, they should be sufficiently large as to enable the underlying sacrificial layer to be removed.

The realisation of said silicon nitride vias 16 is carried out on the silicon by means of a dry etching operation with a reactive ion etching (RIE) technique.

Figure 15H:
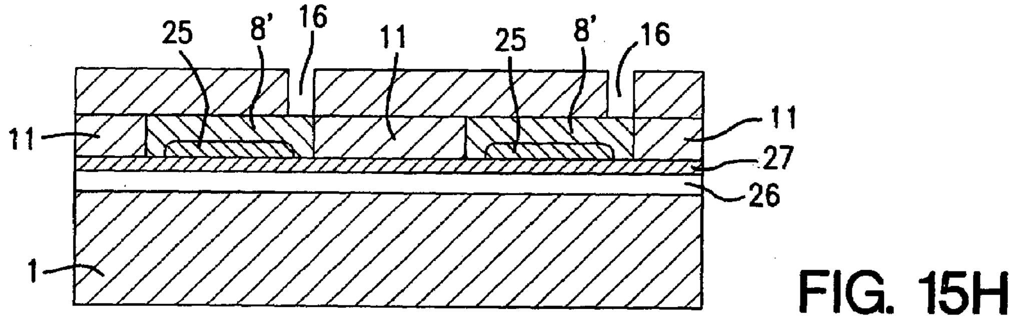

By referring to FIG. 15H, it can be observed that, upon opening the vias 16 through the nitride layer 15, the sacrificial chromium layer 8' is removed by means of a suitable wet etching solution. This etching operation is isotropic and assures a 100% selectivity in respect of the structural nitride and the monoxide SiO of rails 11. The above solution penetrates through holes 16 and removes the chromium underlying the membranes 18, thereby having them in suspended condition.

Figure 15J:
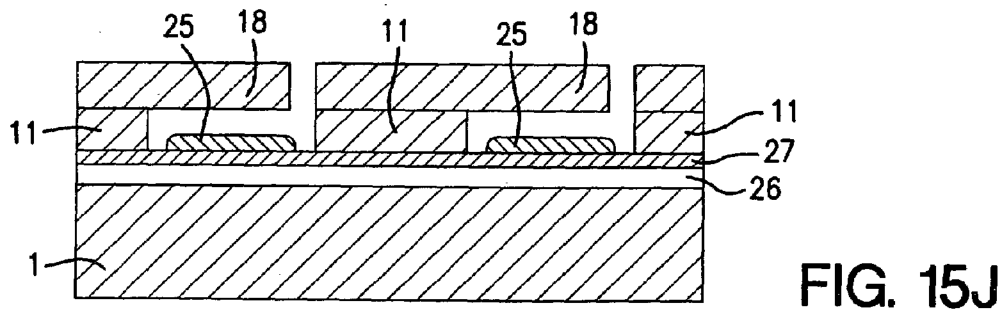

As it is shown in FIG. 15J, the product at this point consists of a matrix of silicon nitride membranes 18 suspended on silicon monoxide supports 11.

Figure 15K:
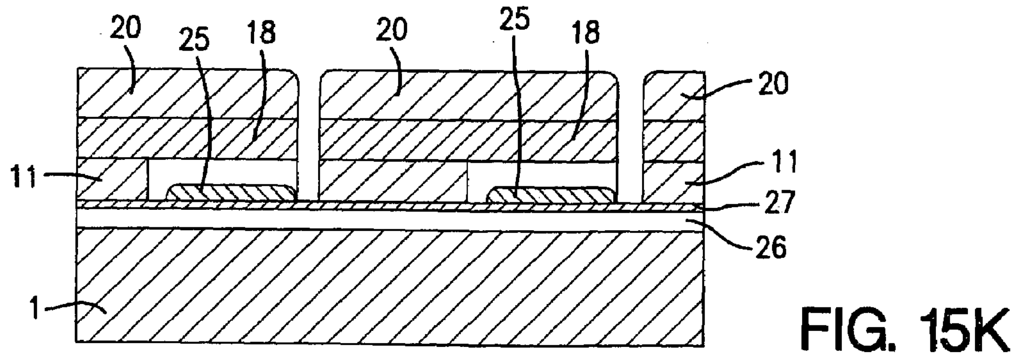

By referring to FIG. 15K, it can be observed that, upon releasing said membranes 18, the above vias 16 are closed by two successive steps: a silicon monoxide SiO deposition by means of an evaporation operation based upon the Joule's effect, with a thickness equal to the thickness of the cavities, and an optical lithographic step.

The vias 16 are closed by column filling them with the same material by which the rails 11 are formed. The thickness of the monoxide layer 20 as deposited should be sufficient to form stoppers 22 extended up to reaching the overlying silicon nitride layer 18.

Figure 15L:
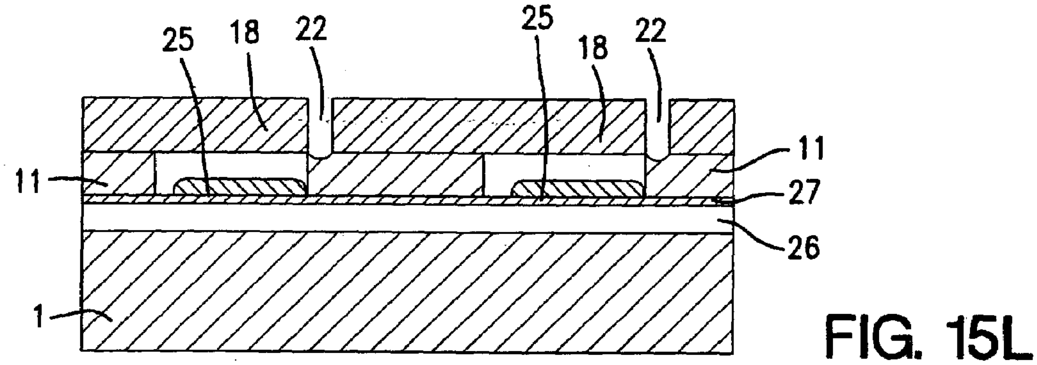
Figure 15M:
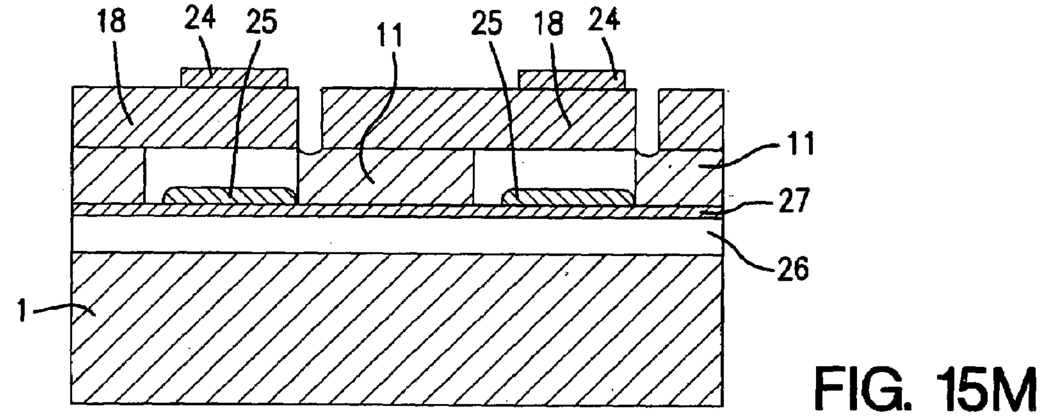

The removal of the monoxide layer 20 deposited on said membranes 18 is carried out by means of an optical lithographic process and a dry etching operation in RIE, thereby obtaining the product shown in FIG. 15L.

The optical lithographic step allows to realise a masking layer of optical resist so shaped as to protect the above said stoppers 22 in respect of the etching step carried out on the silicon monoxide and to leave the monoxide overlying the membranes 18 uncovered, in similar way as shown in FIG. 1L.

It is necessary that said etchant holes 16 be closed, not only in order to enable the concerned transducers to be utilised in immersed condition, but also to protect the cavities from possible contaminations that could modify the vibration properties of said membranes 18, with resulting alteration of the performances of the concerned transducer.

Aiming at further improving the sealing of said vias 16, a thin film of silicon nitride SiN is preferably grown subsequently by means of PECVD technique, which enables hermetic sealing of said vias 16, without significantly modifying the vertical dimension of the transducer.

The subsequent process step is aimed at realising the upper metallisation.

A conductive layer of aluminium is deposited by a sputtering operation. A subsequent deposition of a thin layer of titanium is then carried out also by sputtering.

The pattern of the upper electrodes 24 and of the related interconnections (not overlapping the lower interconnections) is realised by means of an optical lithographic process, under utilisation of a mask realised by means of an electronic lithographic process. Aiming at reducing the parasitic capacitances of the transducer, only said membranes 18 are metallised. Corresponding to rails 11 only connections between electrodes 24 are provided in complementary positions with respect to the connection paths of the electrodes 25 of the lower metallisation, in order to avoid useless overlaps and to reduce any possibly existing parasitic capacitances. The contact to the external circuitry occurs by means of a suitable pad.

The titanium layer in the exposed regions of the optical resist is then removed by means of a dry etching operation in RIE. The underlying exposed aluminium layer is removed by a wet etching operation in a suitable etchant solution, thereby obtaining the product shown in FIG. 15M.

In particular, the pads corresponding to the lower metallisation are opened by means of a lithographic process with related mask and by means of a dry etching operation in RIE aimed at removing the structure silicon nitride $SiN_x$ and the silicon monoxide layers.

Figure 15N:
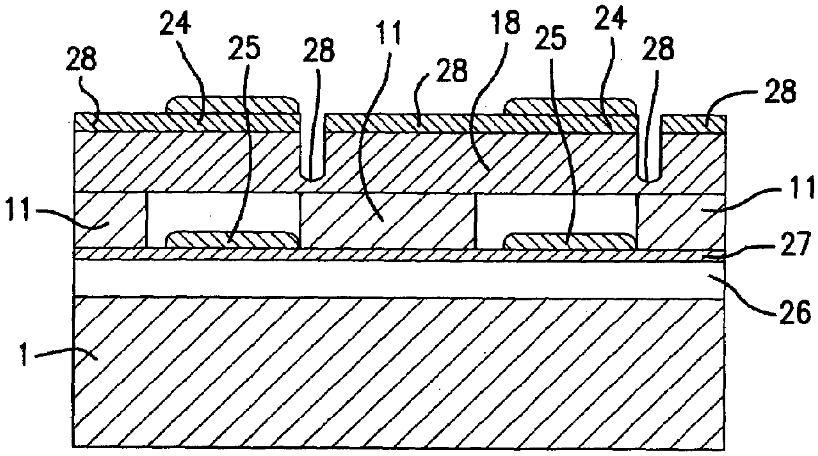

By referring to FIG. 15N, the wafer is then covered by a thin protection layer 28 of silicon nitride $SiN_x$ grown by means of a PECVD technique, utilised for protecting the upper metallisation and to assure hermetic sealing of the cavities.

The pads are opened in order to enable the realisation of the contacts to the measurement external circuitry, by means of an optical lithographic process, with utilisation of a mask realised by means of an electronic lithographic process and a dry etching operation in RIE, for removal of the protection silicon nitride $SiN_x$ corresponding to the lower and upper pads.

Figure 16A:
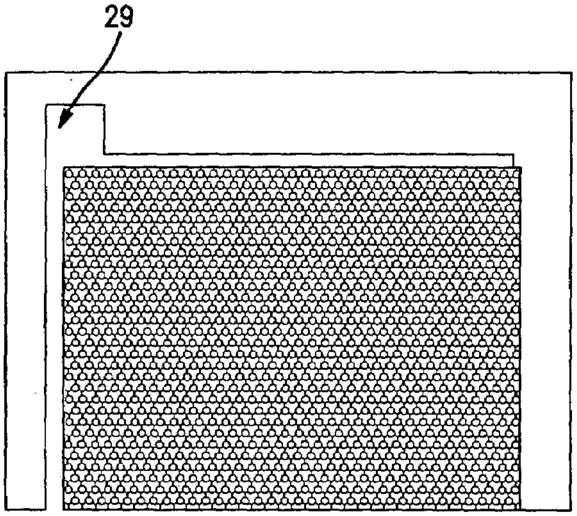
FIG. 16A shows a first pattern utilised for realising the lower metallisations in the process according to FIGS. 15A–15H and 15J–15N.
Figure 16B:
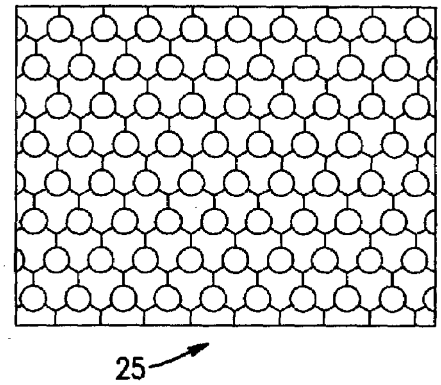
FIG. 16B shows an enlarged portion of the pattern of FIG. 16A.

In particular, FIG. 16A shows a first configuration as utilised for the lower metallisation clearly evidencing pad 29 for connection to the external circuitry. FIG. 16B shows an enlarged portion of the configuration of FIG. 16A.

Figure 17A:
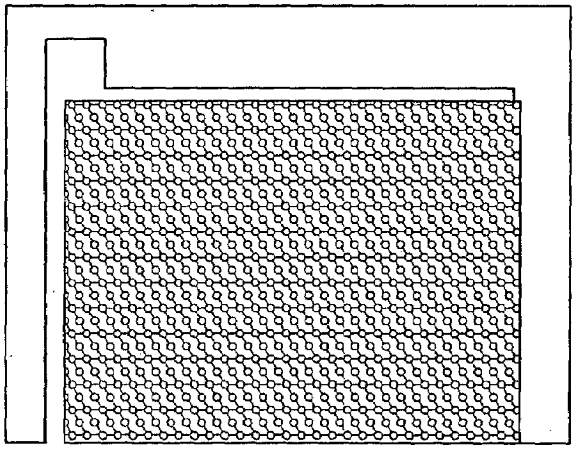
FIG. 17A shows a second pattern utilised for realising the lower metallisations in the process according to FIGS. 15A–15H and 15J–15N.
Figure 17B:
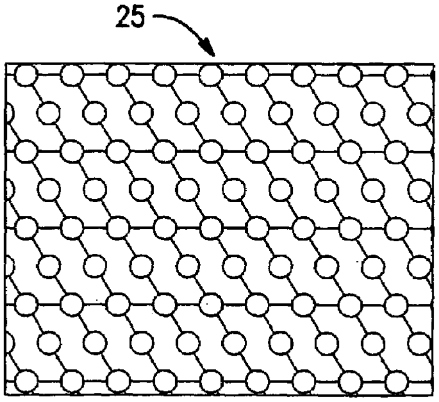
FIG. 17B shows an enlarged portion of the pattern of FIG. 17A.
Figure 18A:
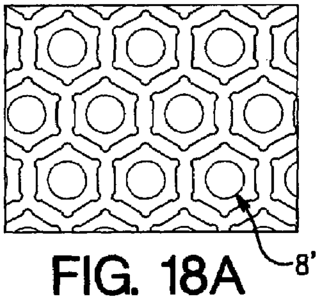
FIGS. 18A–18E show images of first intermediate products obtained during the process of FIGS. 15A–15H and 15J–15N as observed by an optical microscope.
Figure 18B:
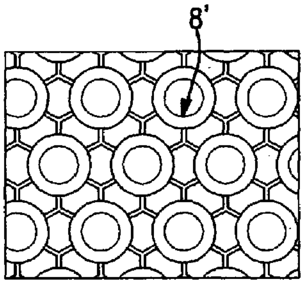
Figure 18C:
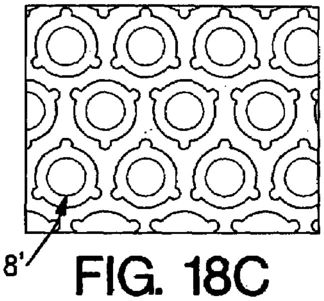
Figure 18D:
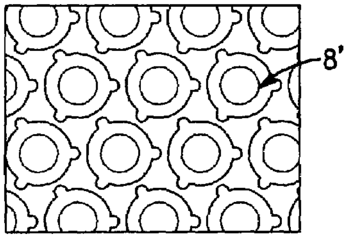
Figure 18E:
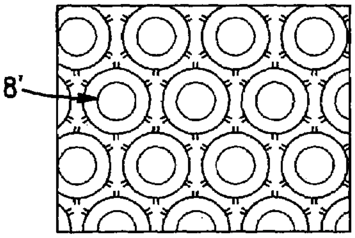
Figure 19A:
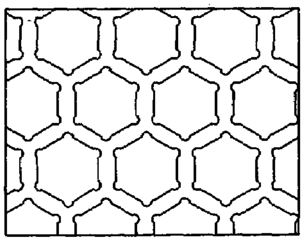
FIGS. 19A–19E show images of second intermediate products obtained during the process of FIGS. 15A–15H and 15J–15N as observed by an optical microscope.
Figure 19B:
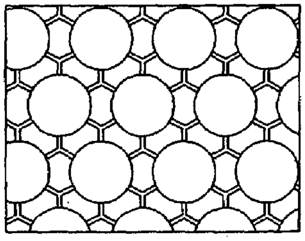
Figure 19C:
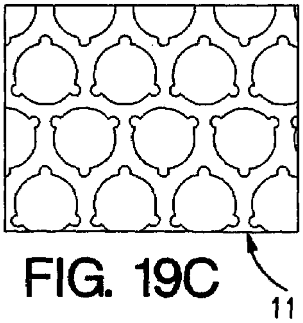
Figure 19D:
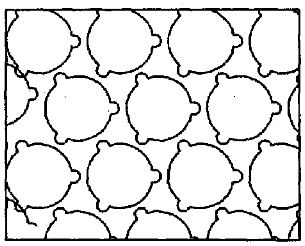
Figure 19E:
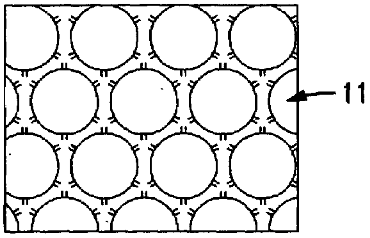
Figure 20A:
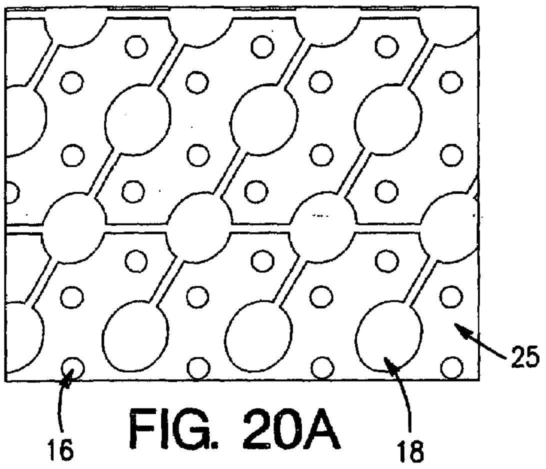
FIGS. 20A–20D show the images of a device realised by the process of FIGS. 15A–15H and 15J–15N as observed by an optic microscope.
Figure 20B:
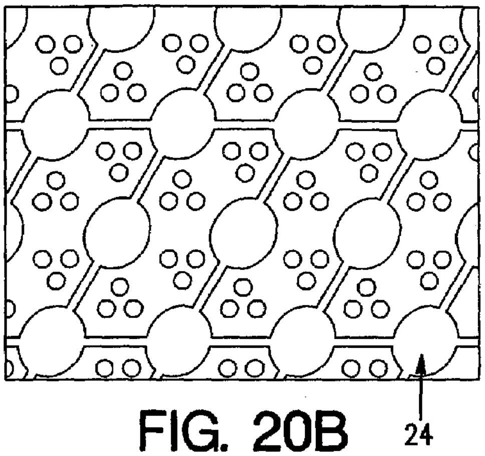
Figure 20C:
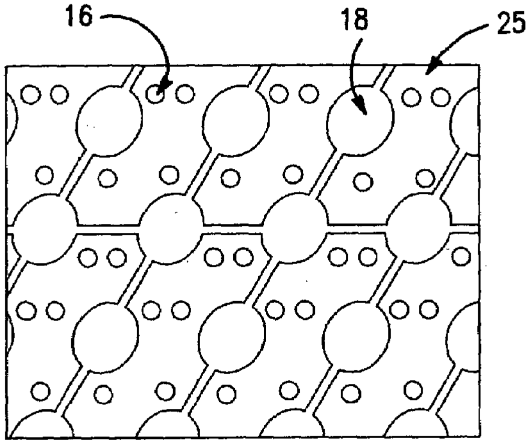
Figure 20D:
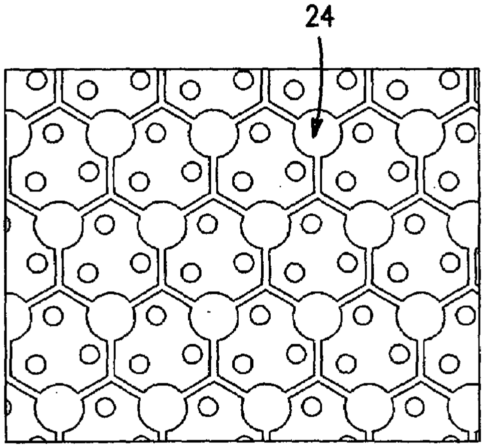

In similar way, FIG. 17A shows a second configuration as utilised for the lower metallisation, and FIG. 17B shows an enlarged portion thereof.

FIGS. 20A, 20B, 20C and 20D show optical microscope images of the finished device, clearly evidencing the membranes 18, the rails 11, the etchant vias 16 and the lower electrodes 25 and upper electrodes 24.

Figure 21:
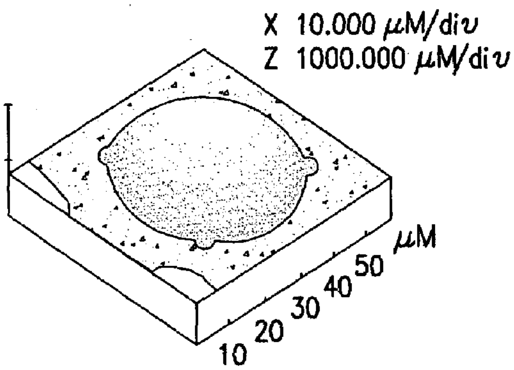
FIGS. 21 and 22 show a view of the AFM of a membrane manufactured by the process according to FIGS. 15A–15H and 15J–15N at two successive times.
Figure 22:
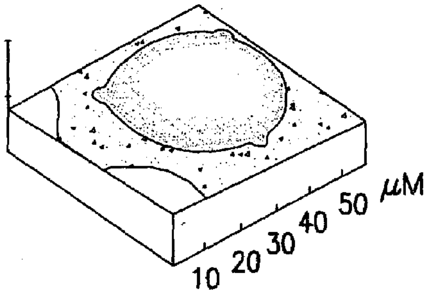

FIG. 21 is an AFM view of a membrane 18 before the thermal annealing step, while FIG. 22 is an AFM of the same membrane 18 after the thermal annealing step.

The preferred embodiments of this invention have been described and a number of variations have been suggested hereinbefore, but it should expressly be understood that those skilled in the art can make other variations and changes, without so departing from the scope thereof, as defined by the enclosed claims.

The invention claimed is:

1. A surface micromachining process for manufacturing Electroacoustic transducers, particularly ultrasonic transducers, said transducers comprising a silicon semiconductor substrate (1), on an upper surface of which one or more membranes (18) of resilient materials are supported by a structural layer (11) of insulating material, rigidly connected to said silicon semiconductor substrate (1), said resilient material having a Young's modulus not lower than 50 GPa, said membranes (18) being metallised, said transducers including one or more lower electrodes (23, 25), rigidly connected to said silicon semiconductor substrate (1), the process comprising the following steps:

A. providing said silicon semiconductor substrate (1),

B. realising an intermediate product comprising:

a sacrificial layer (8, 8'), and a structural layer (11) of insulating material, rigidly connected to an upper surface of said silicon semiconductor substrate (1), the surfaces of said sacrificial layer (8, 8') and of said structural layer (11) not in contact with said silicon semiconductor substrate (1) being substantially co-planar, C. depositing a layer (15) of said resilient material on said sacrificial layer (8, 8') and on said structural layer (11), and D. releasing said membranes (18) of said resilient material by removing said sacrificial layer (8, 8') from the product obtained according to said step C., said process being characterised in that said structural layer (11) includes silicon monoxide.

2. A process according to claim 1, characterised in that all of the steps of the process are carried out at temperatures not higher than 600° C.

3. A process according to claim 2, characterised in that all of the steps of the process are carried out at temperatures not higher than 530° C.

4. A process according to claim 1, characterised in that said resilient material has a value of the Young's modulus not lower than 100 GPa.

5. A process according to claim 4, characterised in that said resilient material comprises silicon nitride.

6. A process according to claim 4, characterised in that said resilient material comprises crystalline silicon.

7. A process according to claim 1, characterised in that said sacrificial material (8') comprises chromium.

8. A process according to claim 1, characterised in that said sacrificial material (8) comprises an organic polymer selected among the group consisting of polyamides and polymers of benzocyclobutene and its derivatives.

9. A process according to claim 8, characterised in that said organic polymer comprises polyamide.

10. A process according to claim 9, characterised in that said polyamide comprises N-methyl-2-pyrolidone.

11. A process according to claim 1, characterised in that said step D comprises the following successively ordered sub-steps:

D.1 realising one or more apertures or vias (16) on said layer (15) of resilient material, adapted to enable accessing the sacrificial layer (8) from outside, and D.2 thermally treating by annealing the product obtained according to said step C.

12. A process according to claim 9, characterised in that, during execution of said substep D.2, the product obtained according to said step C is heated to a temperature in the range of 490° C. to 530° C.

13. A process according to claim 11, characterised in that said sub-step D.2 has a duration adapted to completely eliminate the organic polymer existing in the product obtained according to said step C.

14. A process according to claim 11, characterised in that said step D further comprises, indifferently before or after said sub-step D.1 or D.2, the following sub-step:

D.3 chemically etching said sacrificial layer.

15. A process according to claim 14, characterised in that said sub-step D.3 comprises imaging the product in a wet etching solution for etching chromium.

16. A process according to claim 14, characterised in that said sub-step D.3 comprises imaging the product obtained according to said step C in a solution comprising sulphuric acid ($H_2SO_4$).

17. A process according to claim 16, characterised in that said solution utilised in said sub-step D.3 further comprises hydrogen peroxide ($H_2O_2$).

18. A process according to claim 17, characterised in that said solution utilised in said sub-step D.3 is a solution 7:3 of sulphuric acid ($H_2SO_4$) and hydrogen peroxide ($H_2O_2$).

19. A process according to claim 14, characterised in that, when said sub-step D.3 is subsequent to said sub-step D.2, said step D further comprises, after said sub-step D.3, the following sub-step:

D.4 thermally treating by annealing the product obtained according to said step D.

20. A process according to claim 19, characterised in that, during execution of said sub-step D.4, the product obtained according to said step C is heated to a temperature in the range of 490° C. to 530° C.

21. A process according to claim 11, characterised in that the total duration of the annealing operation for the product obtained according to said step C is adapted to make the intrinsic compression stress of the membranes (18) no higher than 10 MPa.

22. A process according to claim 21, characterised in that the total duration of the annealing operation for the product obtained according to said step C is adapted to make the intrinsic tensile stress of the membranes (18) comprised in the range of 10 MPa to 50 MPa.

23. A process according to claim 11, characterised in that said vias (16) are external to the locations of said membranes (18) and are positioned at a distance therefrom adapted to introduce substantially negligible stress gradients, said sacrificial layer (8) comprising channels (7) to connect the positions of said vias (16) to the locations of said membranes (18).

24. A process according to claim 7, characterised in that said step B comprises the following successively ordered sub-steps:

B.1 depositing a chromium comprising layer (28) on said upper surface of said silicon semiconductor substrate (1), B.2 defining configurations or patterns in said chromium comprising layer (28) by realising cavities in said chromium comprising layer (28), and B.3 filling said cavities in said chromium comprising layer (28) by depositing silicon monoxide therein.

25. A process according to claim 8, characterised in that said step B comprises the following successively ordered sub-steps:

B.1 applying a layer (2) comprising said organic polymer upon said upper surface of said silicon semiconductor substrate (1), B.2 defining configurations or patterns in said layer (2) comprising said organic polymer by realising cavities (10) in said in said layer comprising said organic polymer, and B.3 filling said cavities (10) in said layer (2) comprising said organic polymer by depositing silicon monoxide therein.

26. A process according to claim 24, characterised in that, during said sub-step B.3, the silicon monoxide is deposited by thermal evaporation.

27. A process according to claim 24, characterised in that said sub-step B.2 comprises an optical lithographic process performed on said chromium comprising layer (28) by utilising a masking layer of photographically patterned optical resist and a wet chemical etching of the chromium.

28. A process according to claim 25, characterised in that said sub-step B.2 comprises a dry reactive ion etching (RIE) operation performed on said layer (2) comprising said organic polymer by utilising a masking layer (9) of photolithographically patterned optical resist.

29. A process according to claim 27, characterised in that said step B further comprises, after said sub-step B.3, the following sub-steps:

B.4 chemically etching said silicon monoxide by utilising a wet etching process, B.5 removing said optical resist.

30. A process according to claim 27, characterised in that said step B further comprises, after said sub-step B.3, the following sub-step:

B.4 removing the silicon monoxide deposited upon said optical resist by means of a lift off process.

31. A process according to claim 30, characterised in that said sub-step B.4 comprises dissolving said optical resist by means of an acetone and ultrasound dissolving process.

32. A process according to claim 8, characterised in that said step B comprises the following successively ordered sub-steps:

B.1 depositing a silicon monoxide comprising layer on said upper surface of the semiconductor substrate (1), B.2 defining configurations or patterns (11) in said silicon monoxide comprising layer, B.3 applying a layer (2) comprising said organic polymer upon said upper surface of the semiconductor substrate (1), provided with silicon monoxide, B.4 performing a chemical-mechanical polishing operation adapted to realise said intermediate product.

33. A process according to claim 32, characterised in that during said sub-step B.1, the silicon monoxide is deposited by thermal evaporation.

34. A process according to claim 32, characterised in that said sub-step B.2 comprises a dry reactive ion etching (RIE) operation performed on said silicon monoxide comprising layer by utilising a masking layer of photolithographically patterned optical resist.

35. A process according to claim 1, characterised in that, during said step C, said resilient material is deposited by a plasma enhanced chemical vapour deposition process (PECVD).

36. A process according to claim 11, characterised in that it further comprises, after said step D, the following step:

E. closing said vias (16) by deposition of silicon monoxide adapted to fill up said vias (16), optical lithography, and RIE etching of the silicon monoxide deposited on said membranes (18).

37. A process according to claim 36, characterised in that during said step E, said silicon monoxide is deposited by thermal evaporation.

38. A process according to claim 1, characterised in that it further comprises, before said step B, the following step:

F. realising a lower electrode (25) on the upper surface of the semiconductor substrate (1) in positions corresponding to each area in which said membranes (18) are realised during said step D.

39. A process according to claim 38, characterised in that said step F comprises the following sub-steps:

F.1 depositing an insulating layer (26) on the upper surface of the semiconductor substrate (1), F.2 depositing a conductive layer upon said insulating layer (26), F.3 defining configurations or patterns in said conductive layer.

40. A process according to claim 39, characterised in that said insulating layer (26) comprises thermal silicon dioxide $SiO_2$, said conductive layer comprises evaporation deposited chromium, and said sub-step F.3 comprises an optical lithographic process performed on said conductive layer by utilising a masking layer formed by a photolithographically patterned optical resist and a chemical wet etching of the chromium.

41. A process according to claim 38, characterised in that said step F further realises a film (27) for protection of said lower electrodes (25).

42. A process according to claim 41, characterised in that said protection film (27) is realised by growing a film of silicon nitride sIN by means of a PECVD technique.

43. A process according to claim 1, characterised in that it further comprises the following step:

F. realising one or more lower electrodes (23) by metallisation of a lower surface of said siliconsemiconductor substrate (1).

44. A process according to claim 1, characterised in that it further comprises the following step:

G. metallising said membranes (18).

45. A process according to claim 1, characterised in that said silicon semiconductor substrate (1) is a p-type doped silicon substrate having a resistivity no higher than 1 Ω.cm, preferably no higher than 2 Ω.cm.

46. A process according to claim 1, characterised in that said silicon monoxide comprising structural layer (11) has a thickness in the range of 100 nm to 1000 nm, preferably in the range of 400 nm to 600 nm, and in that said membranes (18) of said resilient material have a thickness no higher than 1000 nm, preferably no higher than 600 nm.

* * * * *